US008709921B2

(12) United States Patent
Su

(10) Patent No.: US 8,709,921 B2
(45) Date of Patent: Apr. 29, 2014

(54) METHOD FOR FORMING A SEMICONDUCTOR DEVICE USING SELECTIVE EPITAXY OF GROUP III-NITRIDE

(75) Inventor: Jie Su, Edison, NJ (US)

(73) Assignee: Applied Materials, Inc., Santa Clara, CA (US)

( * ) Notice: Subject to any disclaimer, the term of this patent is extended or adjusted under 35 U.S.C. 154(b) by 68 days.

(21) Appl. No.: 13/286,097

(22) Filed: Oct. 31, 2011

(65) Prior Publication Data

US 2012/0119218 A1    May 17, 2012

Related U.S. Application Data

(60) Provisional application No. 61/413,889, filed on Nov. 15, 2010.

(51) Int. Cl.
*H01L 21/36* (2006.01)

(52) U.S. Cl.
USPC ............ 438/481; 257/E21.566; 117/95

(58) Field of Classification Search
USPC ............ 438/481; 257/E21.566; 117/95
See application file for complete search history.

(56) References Cited

U.S. PATENT DOCUMENTS 7,691,658 B2    4/2010 Kaeding et al.

OTHER PUBLICATIONS

Zheleva, T.S. et al., Pendeo-Epitaxy—A New Approach for Lateral Growth of Gallium Nitride Structures, Mat. Res. Soc. Symp. Proc. vol. 537, 1999 Materials Research Society, 5 pages.
Nishizuka, K. et al., Efficient Radiative Recombination from <1122>-Oriented $In_xGa_{1-x}N$ Multiple Quantum Well Fabricated by the Regrowth Technique, Applied Physics Letters, vol. 85, No. 15, Oct. 11, 2004, 2004 American Institute of Physics, pp. 3122-3124.
Chiu, C.H. et al., Nanoscale Epitaxial Lateral Ovegrowth of GaN-Based Light-Emitting Diodes on a $SiO_2$ Nanorod-Array Patterned Sapphire Template, Applied Physics Letters 93, (2008) American Institute of Physics, 3 pages.
Benaissa, M. et al., Investigation of AlN Grown by Molecular Beam Epitaxy on Vicinal Si(111) as Templates for GaN Quantum Dots, Applied Physics Letters 89, (2006) American Institute of Physics, 3 pages.
Feltin, E. et al., Epitaxial Lateral Overgrowth of GaN on Si(111), Journal of Applied Physics, vol. 93, No. 1, Jan. 1, 2003, 2003 American Institute of Physics, pp. 182-185.
Kuryatkov, V.V. et al., GaN Stripes on Vertical {111} Fin Facets of (110)-Oriented Si Substrates, Applied Physics Letters 96 (2010) American Institute of Physics.
Hiramatsu, K. et al., Fabrication and Characterization of Low Defect Density (GaN) Using Facet-Controlled Epitaxial Lateral Overgrowth (FACELO), Elsevier Journal of Crystal Growth 221 (2000), pp. 316-326.

*Primary Examiner* — Amar Movva
(74) *Attorney, Agent, or Firm* — Blakely, Sokoloff, Taylor & Zafman LLP

(57) ABSTRACT

A method for forming a single crystalline Group-III Nitride film. A substrate is provided, having a first passivation layer, a monocrystalline layer, and a second passivation layer. The substrate is patterned to form a plurality of features with elongated sidewalls having a second crystal orientation. Group-III Nitride films are formed on the elongated sidewalls, but not on the first or second passivation layers. In one embodiment, the dimensions of the patterned features and the film deposition process result in a single crystalline Group-III Nitride film having a third crystal orientation normal to the substrate surface. In another embodiment, the dimensions and orientation of the patterned features and the film deposition process result in a plurality of single crystalline Group-III Nitride films. In other embodiments, additional layers are formed on the Group-III Nitride film or films to form semiconductor devices, for example, a light-emitting diode.

22 Claims, 32 Drawing Sheets

(1) Top view of GaN (0002) c-plane (2) Si {111} plane (1) With (111) top surface    (2) With (110) top surface    (3) With (001) top surface

| Off-cut angle α (°)-from Si (110) | GaN Plane in z-direction | Tilt angle θ of elongated sidewall |
|---|---|---|
| 0 | {112-0} | 90 |
| 5.9 | {112-1/3} | 84.1 |
| 8.7 | {112-1/2} | 81.3 |
| 17.1 | {112-1} | 72.9 |
| 31.6 | {112-2} | 58.4 |
| 42.7 | {112-3} | 47.3 |

| Off-cut angle α (°)- from Si(11-2) | Off-cut angle α (°)-from Si (110) | Off-cut angle α (°)-from Si (100) | GaN Plane in z-direction | Tilt angle θ of elongated sidewall |
|---|---|---|---|---|
| 0 | -54.7 | 35.3 | {101-0} | 90 |
| 10.1 | -44.6 | 25.2 | {101-1/3} | 79.9 |
| 14.9 | -39.8 | 20.4 | {101-1/2} | 75.1 |
| 28 | -26.7 | 7.3 | {101-1} | 62.0 |
| 46.8 | -7.9 | -11.5 | {101-2} | 43.2 |
| 58 | 3.3 | -22.7 | {101-3} | 32.0 |

| Off-cut angle α (°)-from Si (111) | GaN Plane in z-direction | Tilt angle θ of elongated sidewall |
|---|---|---|
| 0 | {0002} | 90 |
| 72.9 | {112-1} | 17.1 |
| 58.4 | {112-2} | 31.6 |
| 47.3 | {112-3} | 42.7 |
| 39.1 | {112-4} | 50.9 |
| 33.0 | {112-5} | 57 |

| Off-cut α (°)- from Si(111) | Off-cut α (°)- from Si (100) | Off-cut α (°)- from Si (110) | GaN Plane in z-direction | Tilt angle θ of elongated sidewall |
|---|---|---|---|---|
| 0 | -54.7 | 35.3 | {0002} | 90 |
| 62.0 | 7.3 | -26.7 | {101-1} | 90 |
| 43.2 | -11.5 | -7.9 | {101-2} | 90 |
| 32.0 | -22.7 | 3.3 | {101-3} | 90 |
| 25.1 | -29.6 | 10.2 | {101-4} | 90 |
| 20.6 | -34.1 | 14.7 | {101-5} | 90 |

| Si Patterned Features 102 | GaN Film 103 |

- - - - - - - - - - - - - - - - - - - - -

Sapphire Patterned Features 102  GaN Film 103

METHOD FOR FORMING A SEMICONDUCTOR DEVICE USING SELECTIVE EPITAXY OF GROUP III-NITRIDE

This Application claims the benefit of and priority to Provisional Application Ser. No. 61/413,889 filed Nov. 15, 2010 which is hereby incorporated by reference.

BACKGROUND

1. Field

The present invention relates generally to the manufacture of semiconductor devices. In particular, the present invention relates to the formation of a single-crystal Group-III Nitride film with a desired orientation on a patterned substrate.

2. Discussion of Related Art

Single-crystal Group III-Nitride films and related optical and electrical devices are typically grown from planar c-plane sapphire substrates, with the (0001)/c-plane of the Group III-Nitride film oriented in the z-direction, normal to the substrate surface. The c-plane of a Group III-Nitride is polar and has a piezoelectric field; both properties can affect device performance due to energy band distortion, separation of electrons and holes, and reduction of the radiative recombination efficiency. In LED devices, c-plane polarization also causes increasing blue-shift in the peak emissions wavelength as the injection current increases.

A-plane and m-plane Group III-Nitride films may also be grown from planar sapphire substrates. Group III-Nitride a- and m-planes are non-polar. However, films grown in the direction of these planes typically have a higher threading dislocation density and basal-plane stacking faults than c-plane Group III-Nitride films. Threading dislocations form due to differences in lattice constant, thermal expansion coefficient (TEC) and interfacial surface energy between the Group III-Nitride film and the sapphire substrate. Threading dislocations can negatively impact device efficiency and performance.

Group III-Nitride films may also be grown from planar silicon substrates. Such films typically have even greater threading dislocation densities when compared to films grown on planar sapphire substrates due to larger differences in lattice constant and TEC between silicon and Group III-Nitrides. Lattice constant and TEC differences also can give rise to high film stress, which, compounded over the surface of the substrate, can lead to wafer-bowing or film delamination. Buffer and transition layers may be used to reduce the impact of lattice constant and TEC differences on Group III-Nitride films and devices.

Growth of Group III-Nitride films from patterned substrates using methods such as epitaxial lateral overgrowth (ELO) or pendeo-lateral epitaxy can produce films with lower threading dislocation densities. Lateral-growth methods reduce threading dislocation density through the dislocation bending phenomena, wherein a change in the direction of film growth terminates existing threading dislocations.

SUMMARY

A method of depositing a single-crystal Group III-Nitride film with a desired orientation on a patterned substrate is described. A substrate is patterned to form a plurality of patterned features with elongated sidewalls. Group III-Nitride films are nucleated on selected elongated sidewalls that are oriented to enable growth of films with a desired lateral crystal orientation. In one embodiment, the Group III-Nitride films are used to form a plurality of semiconductor devices on the sidewalls. In another embodiment, the Group III-Nitride films are grown until they coalesce to form a planar single-crystal Group III-Nitride film with a desired orientation in the z-direction. In an embodiment, the planar, coalesced single-crystal Group III-Nitride film is used to form a semiconductor device.

DETAILED DESCRIPTION

Figure 1A:
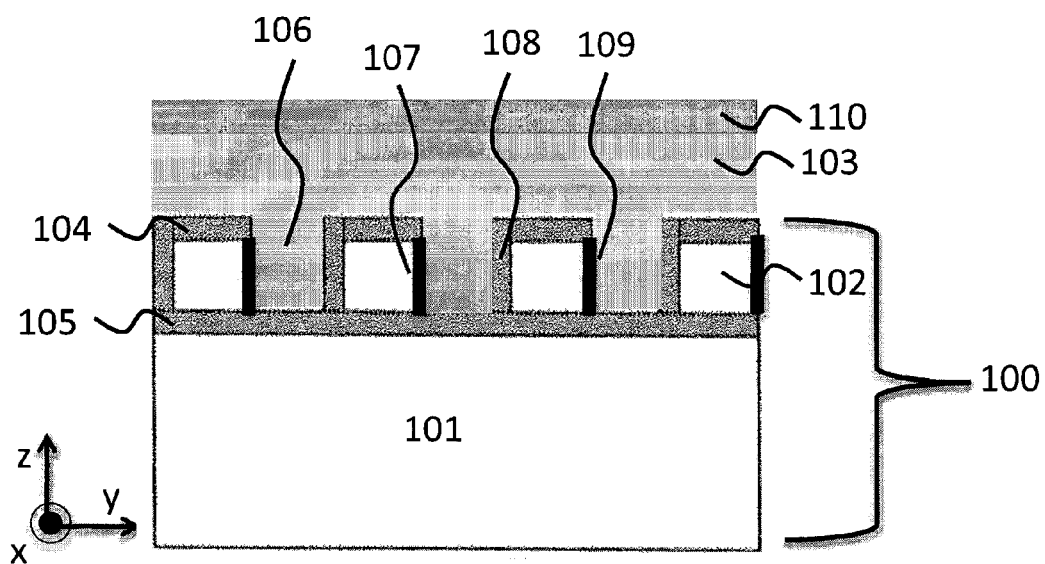
FIG. 1A is an illustration of a cross-sectional view of a Group III-Nitride epitaxial film with a desired orientation formed on a patterned substrate in accordance with an embodiment of the present invention.

Embodiments of the present invention include a method of forming one or more Group III-Nitride films on a patterned substrate. Other embodiments include employing the Group III-Nitride film as a basis for a semiconductor device, such as a light emitting diode (LED), laser diode, high electron mobility transistors (HEMTs), hetero junction bipolar transistors (HBTs) and quantum well devices. The present invention has been described with respect to specific details in order to provide a thorough understanding of the invention. One of ordinary skill in the art will appreciate that the invention can be practiced without these specific details. In other instances, well known semiconductor processes and equipment have not been described in specific detail in order to not unnecessarily obscure the present invention.

A method for forming one or more single-crystal Group III-Nitride films with a desired orientation on a patterned substrate is disclosed herein. The substrate is patterned to form patterned features with elongated sidewalls. Group III-Nitride films are grown on selected elongated sidewalls.

The size and spacing of the patterned features determines whether one or several films are grown. Smaller, closely-spaced patterned features allow films that are grown from separate elongated sidewalls to coalesce, resulting in one single-crystal Group III-Nitride film. In an embodiment, additional layers of material are deposited on top of the coalesced Group III-Nitride film to form a semiconductor device. Larger, widely-spaced patterned features support the growth of individual films by preventing coalescence. In an embodiment, space between the patterned features is sufficient to allow deposition of additional device layers over each of the Group III-Nitride films to form a plurality of semiconductor devices on the sidewalls.

The material, geometry and crystallographic orientation of a patterned feature are selected so as to form at least one elongated sidewall with a spatial and crystallographic orientation that causes the growth of a Group III-Nitride film with the desired crystallographic orientation. In the case where a coalesced single-crystal Group III-Nitride film is grown, the initial growth direction—laterally, from an elongated sidewall—differs from the ultimate surface orientation of the coalesced film—in the vertical direction. Thus, the orientation of the elongated sidewall is selected to produce both Group III-Nitride growth in a particular crystallographic direction initially in the lateral direction, and also to result in a film with the desired surface orientation in the z-direction post-coalescence.

In the case where Group III-Nitride films are not grown to coalescence (i.e. remain separate films), the crystallographic orientation at the surface of each film is directly complementary to the orientation of the elongated sidewall on which it was grown. Thus, patterned features are patterned so as to create elongated sidewalls with an orientation directly complementary to that of the desired Group III-Nitride orientation.

One embodiment of the current invention forms a non-polar or semi-polar, coalesced Group III-Nitride film over a plurality of patterned features on a substrate. Another specific embodiment forms a polar, coalesced Group III-Nitride film over a plurality of patterned features on a substrate. Another specific embodiment forms a plurality of polar Group III-Nitride films on the elongated sidewalls of patterned features.

FIG. 1A is an illustration of a cross-sectional view of a Group III-Nitride film 103 formed on patterned substrate 100 in accordance with an embodiment of the present invention. Patterned substrate 100 comprises substrate 101, first passivation layer 105, and a plurality of patterned features 102. Each patterned feature 102 has at least one elongated sidewall 107 and is separated from neighboring patterned feature 102 by trench 106. In an embodiment, top passivation layer 104 is formed on the top surface of patterned feature 102. Optionally, sidewall passivation layer 108 is formed on one of the two elongated sidewalls 107 of each patterned feature 102. A buffer layer 109 may optionally be deposited over elongated sidewall 107 that is not covered by sidewall passivation layer 108.

Figure 2:
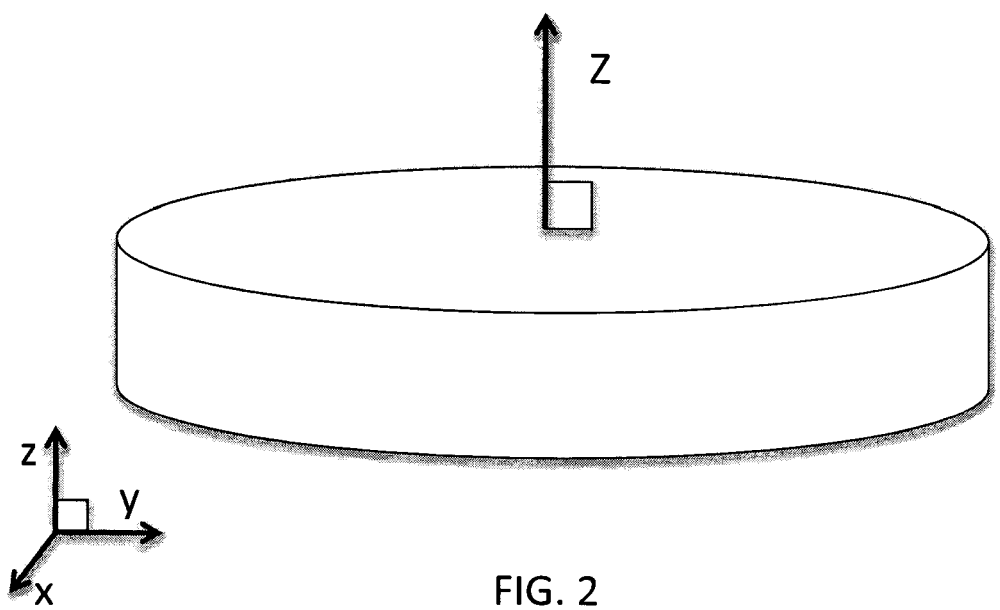
FIG. 2 is an illustration of the spatial orientation of a planar substrate.

Base substrate 101 can be any material capable of supporting patterned features 102 that enable epitaxial growth of a Group III-Nitride film. In an embodiment of the present invention, substrate 101 is monocrystalline or single-crystalline silicon (Si). A Si substrate 101 may have a (100), (110), or (111) orientation in the z-direction. In another embodiment, Si substrate 101 is offcut. FIG. 2 illustrates the z-direction relative to a wafer substrate. In another embodiment, substrate 101 is single crystal sapphire ($Al_2O_3$). A sapphire substrate 101 may have a (0001), (101-0), or (112-0) orientation in the z-direction. In another embodiment, sapphire substrate 101 is offcut. In alternative embodiments, substrate 101 is silicon carbide (SiC), silicon on diamond (SOD), quartz ($SiO_2$), glass, zinc oxide (ZnO), magnesium oxide (MgO), or lithium aluminum oxide ($LiAlO_2$).

First passivation layer 105 covers the surface of substrate 101. First passivation layer 105 may be $SiO_x$ or $Si_xN_y$ or any material that prevents the nucleation of Group III-Nitride on the surface that it covers. First passivation layer 105 is of a thickness sufficient to prevent growth of Group III-Nitride on substrate 101. In an embodiment, first passivation layer 105 is 10-60 nm thick. In an embodiment, first passivation layer 105 has windows (not shown) cut through it connecting substrate 101 to patterned features 102.

In an embodiment, patterned substrate 100 contains patterned features 102 on top of first passivation layer 105. In one embodiment, patterned feature 102 is monocrystalline or single-crystalline Si. In another embodiment, patterned feature 102 is monocrystalline or single-crystalline sapphire. The dimensions and spacing of patterned features 102 are selected to facilitate coalescence of Group III-Nitride films that are grown from each patterned feature 102 to form a coalesced, single-crystal Group III-Nitride film 103. In an embodiment, patterned feature 102 is 1-4 μm wide, 1-4 μm tall, and 100-400 μm long. Neighboring patterned features 102 are spaced 1-4 μm apart in an embodiment.

In the embodiment shown in FIG. 1A, top passivation layer 104 covers the top surface of patterned feature 102. Top passivation layer 104 can be any material suitable to prevent growth thereon. In an embodiment, top passivation layer 104 is $SiO_2$ or $Si_xN_y$. Top passivation layer 104 has a thickness sufficient to prevent the nucleation of Group III-Nitride on the top surface of patterned feature 102, such as a thickness between 10-60 nm.

An embodiment of the invention features an optional sidewall passivation layer 108 covering an elongated sidewall 107. Sidewall passivation layer 108 prevents the nucleation and growth of a Group III-Nitride film, so that a film may only be nucleated on an elongated sidewall 107 that is not covered by a passivation layer. In an embodiment, sidewall passivation layer 108 is $SiO_2$ or $Si_xN_y$, and has a thickness sufficient to prevent the deposition of Group III-Nitride on the underlying elongated sidewall 107, such as a thickness between 10-60 nm.

In an embodiment of the present invention, Group III-Nitride film 103 is any Group-III Nitride that may be deposited by any suitable epitaxial process, such as hydride vapor phase epitaxy (HYPE), metalorganic chemical vapor deposition (MOCVD), or molecular beam epitaxy (MBE). Group III-Nitride film 103 may be a binary, ternary, or quarternary compound semiconductor film formed from a Group III element or elements selected from gallium, indium and aluminum and nitrogen. That is, the Group III-Nitride film 103 can be any solid solution or alloy of one or more Group III element and nitrogen, such as but not limited to GaN, AlN, InN, AlGaN, InGaN, InAlN, and InGaAlN. Group III Nitride film 103 can have any thickness in the z-direction, generally between 1-10 μm and more typically formed between 3-7 μm.

In an embodiment, the crystallographic orientation of Group III-Nitride film 103 is determined by the orientation of the elongated sidewalls 107 on which the film is nucleated. The crystallographic orientation of the Group III-Nitride film 103 in the z-direction may be any of the following orientations: the polar c-plane (0001), the non-polar m-plane (101-0), the non-polar a-plane (112-0), or any semi-polar plane $(112\text{-}n)/(101\text{-}n)$, where n=1, 2, 3, 4 . . . Other orientations are possible.

Additionally, Group III-Nitride film 103 can be doped or undoped. The Group III-Nitride film 103 can be p-type doped using any p-type dopant such as but not limited to Mg, Be, Ca, Sr, or any Group I or Group II element having two valence electrons. The Group III-Nitride film 103 can be p-type doped to a conductivity level of between $1\times10^{16}\text{-}1\times10^{20}$ atoms/cm$^3$. The Group III-Nitride film 103 can be n-type doped using any n-type dopant such as but not limited to Si, Ge, Sn, Pb, or any suitable Group IV, Group V, or Group VI element. The Group III-Nitride film 103 can be n-type doped to a conductivity level between $1\times10^{16}\text{-}1\times10^{20}$ atoms/cm$^3$.

In an embodiment of the present invention, an optional buffer layer 109 covers exposed elongated sidewall 107. Buffer layer 109 can be any suitable Group III-Nitride crystalline layer. Buffer layer 109 can be a binary, ternary or quaternary film comprising a solid solution of one or more Group III elements and nitrogen. Buffer layer 109 can be any crystalline film that is latticed matched (i.e., has the same cubic structure) with the Group III-Nitride crystalline film that is to be formed. Buffer layer 109 will generally have a lattice constant between the lattice constant of elongated sidewall 107 and Group III-Nitride layer 103 to better match elongated sidewall 107 and to provide thermal stability. Buffer layer 109 may be formed by HVPE, MOCVD, PVD or plasma treatment. The process used may be the same as or different from that used to form the bulk Group III-Nitride layer 103. Buffer layer 109 is ideally formed in situ (i.e. in the same chamber and without breaking vacuum) with Group III-Nitride film 103. Alternatively, buffer layer 109 may be formed in a separate chamber than that used to form the bulk film. In an embodiment of the present invention, buffer layer 109 is formed to a thickness between 10-100 nm, but thickness could vary and in some cases it could be up to 0.5 ×1.0 μm. Buffer layer 109 is not limited to native nitride materials, but other layers lattice-matched to the Group III-Nitride film can be used: such as but not limited to ZnO, LiAlO2, and SiC.

Figure 3A:
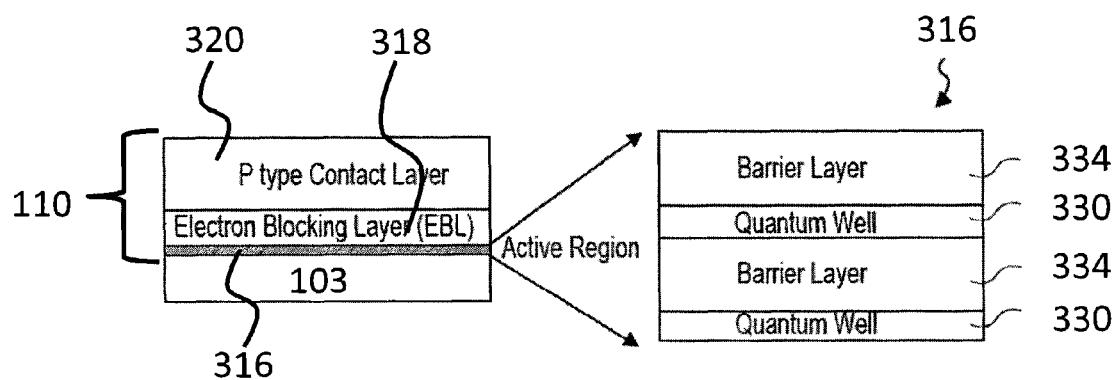
FIG. 3A is an illustration of additional device layers that may be formed on a planar gallium nitride film to form a light emitting diode.

Additional device layers 110 may be formed on top of Group III-Nitride film 103, which may be necessary for the fabrication of the desired semiconductor device. In an embodiment of the invention, additional device layers 110 form an LED device. An illustration of an embodiment of additional layers 110 that form an LED device is shown in FIG. 3A. In FIG. 3A, at least a portion of Group III-Nitride film 103 is n-type doped near the surface adjacent to additional device layers 110. Additional device layers 110 comprise an active region 316 formed over Group III-Nitride film 103, electron blocking layer 318 formed over active region 316, and p-type contact layer 320 formed over electron blocking layer 318. Active region 316 comprises alternating layers of quantum well 330 and barrier layer 334.

Figure 1B:
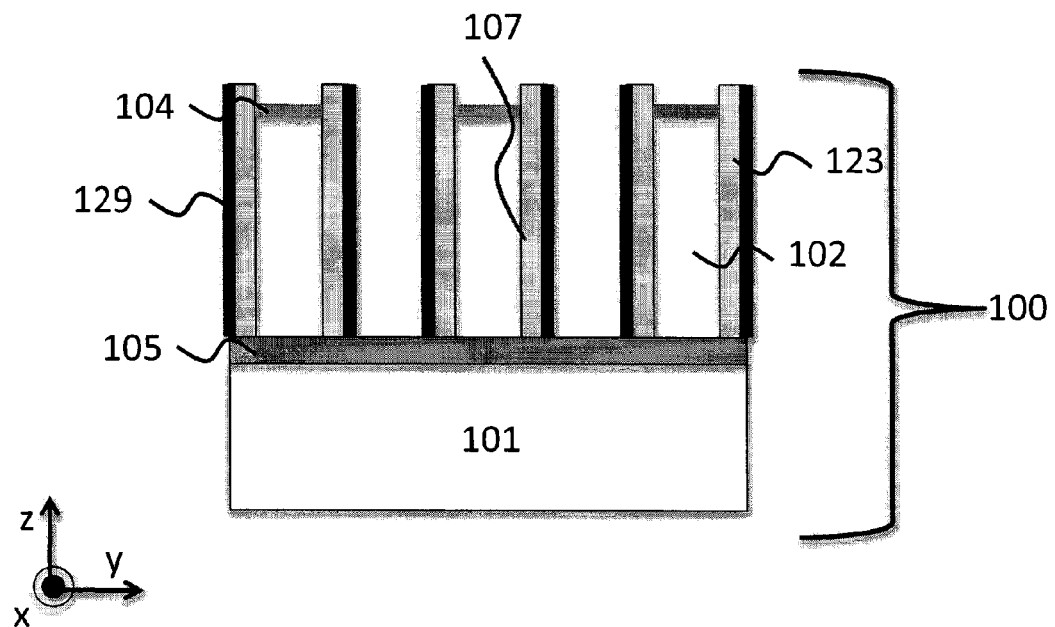
FIG. 1B is an illustration of a cross-sectional view of a plurality of Group III-Nitride films with a desired orientation formed on a patterned substrate in accordance with an embodiment of the present invention.

FIG. 1B illustrates a cross-sectional view of a plurality of Group III-Nitride epitaxial films formed on the sidewalls of features patterned on a substrate. In an embodiment substrate 101 is single-crystal silicon. The Si substrate orientation can be (100), (111), or (110). In another embodiment, substrate 101 is single-crystal sapphire. The sapphire substrate crystal orientation can be (101-0) or (112-0).

In an embodiment, first passivation layer 105 covers the top surface of substrate 101. First passivation layer may be $SiO_2$ or $Si_xN_y$ or any material that prevents the nucleation of Group III-Nitride on the surface that it covers. First passivation layer 105 is of a thickness sufficient to prevent the nucleation of Group III-Nitride on substrate 101. Typically, first passivation layer 105 is 10-60 nm thick.

Each patterned feature 102, located on top of first passivation layer 105, has two elongated sidewalls 107. A 10-60 nm top passivation layer 104 covers the top of each patterned feature 102 in an embodiment of the present invention. An optional buffer layer (not shown) may cover each elongated sidewall 107, as described above with respect to FIG. 1A.

The spacing of patterned features 102 prevents coalescence of neighboring Group III-Nitride films 123 that are grown on adjacent elongated sidewalls 107 in an embodiment of the invention. Patterned features 102 are spaced at intervals of 25-100 μm according to embodiments of the invention. In a typical embodiment, patterned features 102 are spaced at intervals of 50 μm. Typically Group III-Nitride film 123 is 3-7 μm thick. In accordance with embodiments of the invention, Group III-Nitride film 123 may be deposited by HVPE, MOCVD, MBE, or any suitable process, as described above with respect to Group III-Nitride film 103 in FIG. 1A. In addition, group III-Nitride film 123 may have any of the crystallographic and doping properties of Group III-Nitride film 103, as discussed above with respect to FIG. 1A.

Figure 3B:
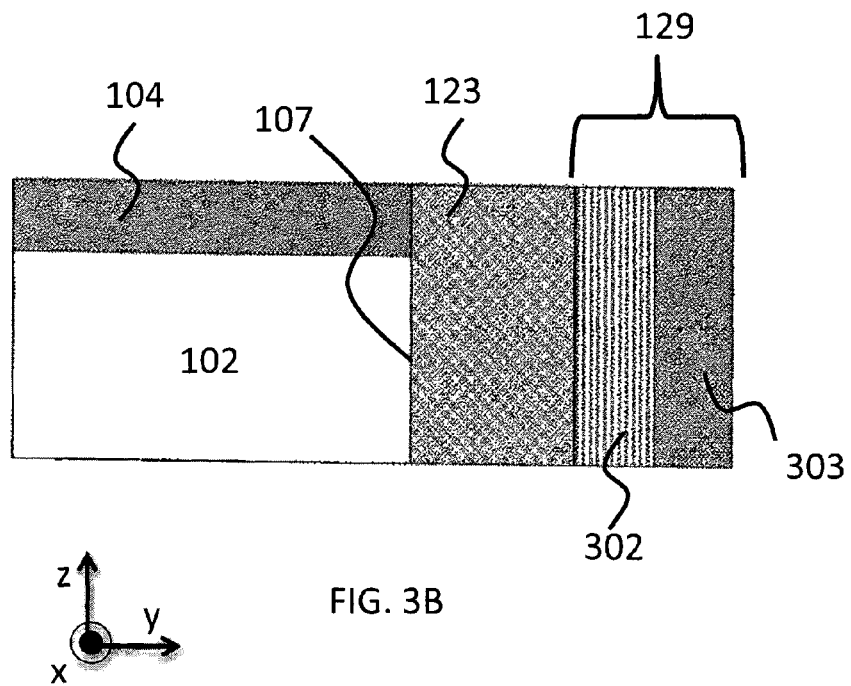
FIG. 3B is an illustration of an LED device formed by depositing additional device layers over a gallium nitride film formed on the elongated sidewall of a patterned feature.

In an embodiment, the spacing of patterned features 102 also provides sufficient room for additional device layers 129 on top of Group III-Nitride film 123 in order to form a plurality of semiconductor devices. In an embodiment, the spacing of patterned features 102 is also sufficient to allow formation of insulating layers and conductive layers in order to make contacts for devices and to allow the coupling of devices together into a single device. In another embodiment, multiple devices are formed on a single sidewall. In an embodiment, additional device layers 129 form an LED device, as shown in FIG. 3B. In FIG. 3B, a portion of patterned feature 102, a portion of top passivation layer 104 on top of patterned feature 102, and a portion of Group III-Nitride film 123 grown on elongated sidewall 107 are shown according to an embodiment of the invention. At least a portion of Group III-Nitride film 123 is n-type doped near the surface adjacent to additional device layers 129. Multi-quantum well 302 covers Group III-Nitride film 123, and p-doped layer 303 covers multi-quantum well 302 in embodiments of the invention.

Figure 4A:
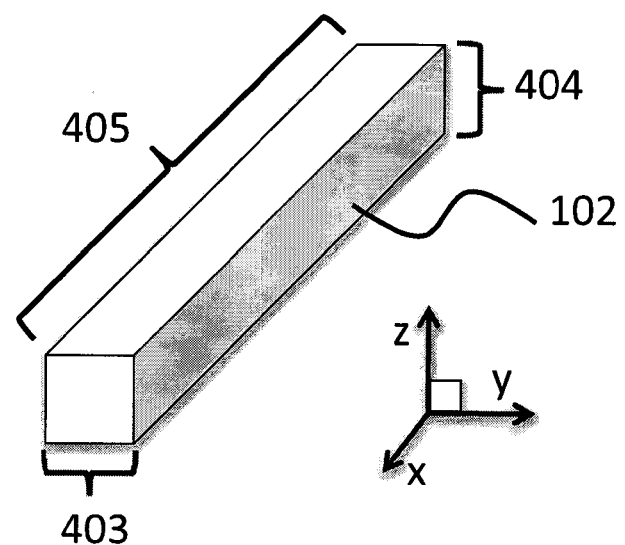
FIG. 4A is an illustration of an overhead view of a pattern of features formed on a substrate in accordance with an embodiment of the present invention.

The spatial arrangement, dimensions, shape, material, and crystallographic orientation of the patterned features are selected to allow the nucleation and growth of a Group III-Nitride film with desired orientation, quality, and surface properties. Examples of patterned features are shown in FIGS. 4A-4D, in accordance with embodiments of the invention. FIG. 4A illustrates a three-dimensional perspective view of an embodiment of a single patterned feature 102 with height 404, width 403, and length 405.

Figure 4B:
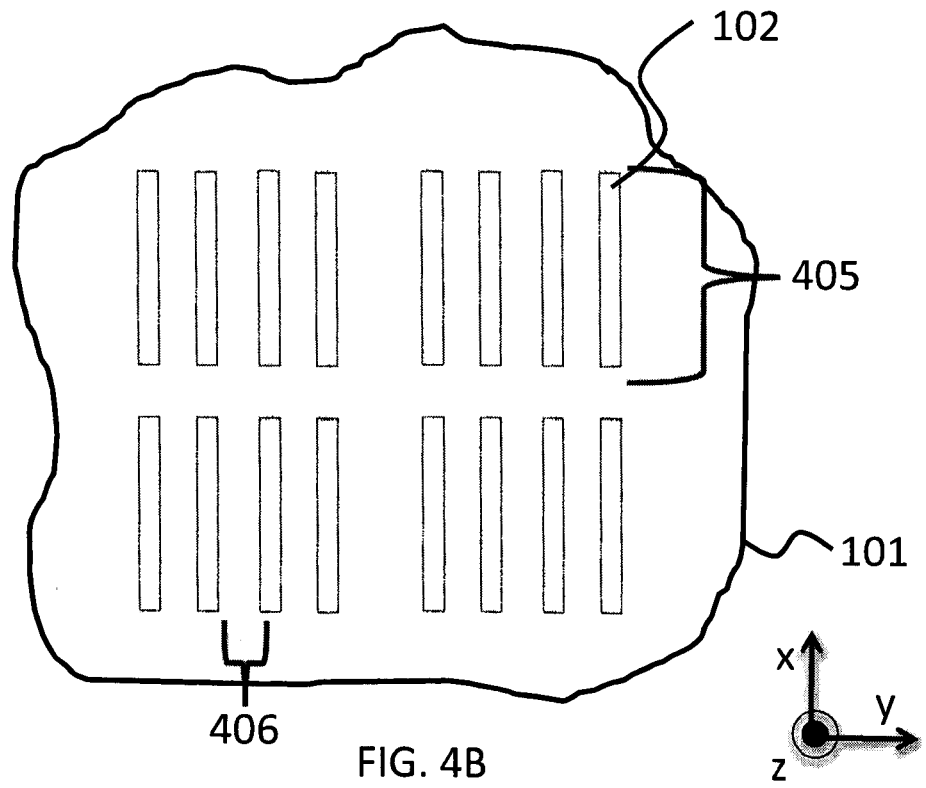
FIG. 4B is an illustration of a three-dimensional perspective view of an embodiment of a single patterned feature.

FIG. 4B illustrates an overhead view of the spatial arrangement of patterned features 102 on a portion of substrate 101 according to an embodiment of the invention. Patterned features 102 are arranged to enable growth of a Group III-Nitride film laterally from at least one elongated sidewall of a patterned feature 102. In an embodiment, the length 405 of patterned features 102 is 200-500 μm in order to minimize the buildup of interfacial stresses between the Group III-Nitride film and the patterned feature, which compound over longer interfaces. Interfacial stresses can arise as the substrate is cooled after deposition due to differences in the thermal expansion coefficient of the patterned feature material and the Group III-Nitride, and may cause delamination of the Group III-Nitride film.

Figure 4C:
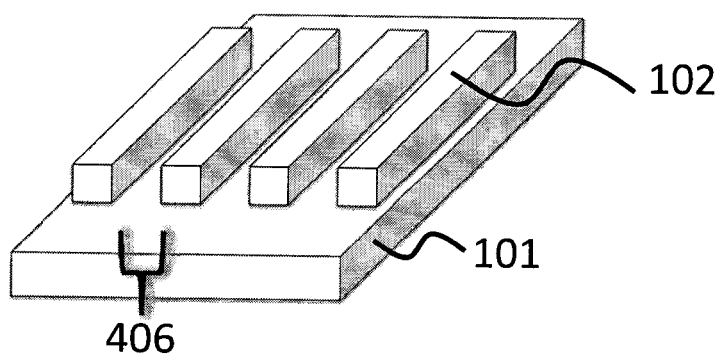
FIGS. 4C-4D illustrate three-dimensional perspective views of alternative embodiments of a patterned substrate.

In an embodiment shown in the three dimensional perspective drawing in FIG. 4C, patterned features 102 have smaller dimensions and are spaced closely together to enable coalescence of films nucleated on neighboring features. In an embodiment, patterned features 102 have a height 404 of 1-4 μm, a width 403 of 1-4 μm, a length 405 of 100-400 μm, and spacing 406 of 1-4 μm.

Figure 4D:
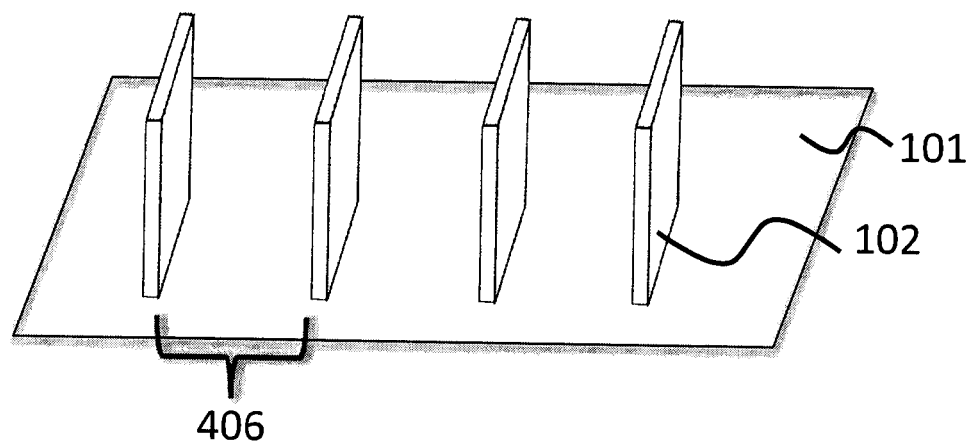

In an embodiment such as the one shown in FIG. 4D, patterned features 102 are larger and spaced more widely apart to prevent coalescence of neighboring Group III-Nitride films and to allow space for the formation of additional device layers required to form a semiconductor device on each sidewall. Also, in an embodiment, the elongated sidewalls of patterned features 102 have a large surface area in order to provide sufficient area to form devices thereon. In an embodiment, patterned features 102 have a height 404 of 25-75 μm, a width 403 of 25-75 μm, a length 405 of 200-400 μm, and spacing 406 of 50-100 μm. Typically, patterned features 102 have a height 404 of 50 μm, a width 403 of 50 μm, and a length 405 of 300 μm. Other arrangements of patterned features 102 on substrate 101 are possible.

FIGS. 5A-5I illustrate a method for patterning a substrate. A substrate 101 is patterned to form patterned features 102 with elongated sidewalls 107. Elongated sidewalls 107 have a uniform crystallographic orientation to serve as a nucleation site for Group III-Nitride films. The crystallographic orientation of elongated sidewalls 107 is selected to allow growth of Group III-Nitride with a desired orientation in the z-direction.

Figure 5A:
FIGS. 5A-5J illustrate a method of forming patterned features on a substrate, according to an embodiment of the invention.
Figure 6A:
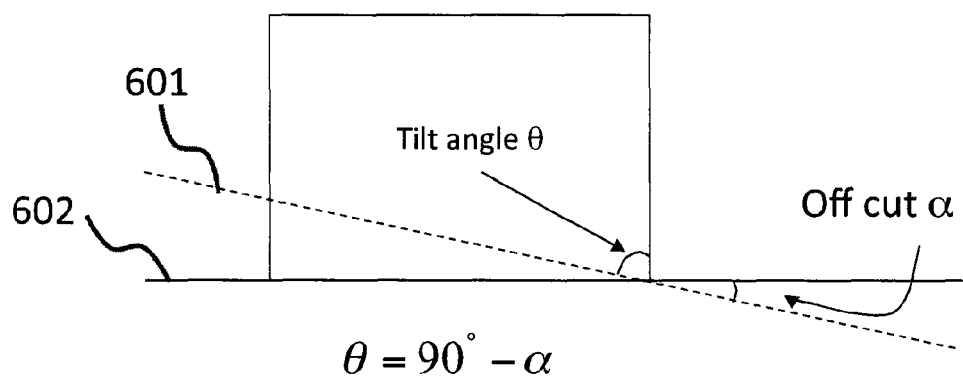
FIG. 6A illustrates a cross-sectional view of an embodiment of a patterned feature with a rectangular cross-section. Offcut angle $\alpha$ and tilt angle $\theta$ are indicated for an offcut substrate.

In FIG. 5A, a substrate 101 is provided. In an embodiment, the substrate is single-crystal silicon. A silicon substrate 101 may have an orientation of (110), (111), or (100) in the z-direction. FIG. 2 shows a three-dimensional perspective view of a wafer with the z-direction normal to the substrate surface. In another embodiment, substrate 101 is silicon offcut from the (110), (111), or (100) planes. FIG. 6A illustrates an offcut substrate surface, wherein the angle between the physical substrate surface 601 and the surface of the crystallographic plane 602 is offcut angle α. According to embodiments of the invention, offcut angle α ranges from −90 to 90 degrees.

Figure 5B:
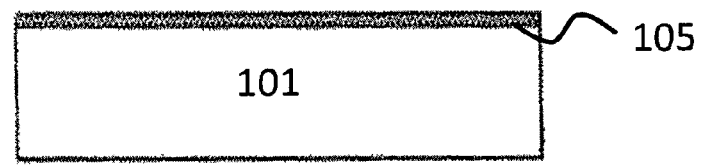

In FIG. 5B, a first passivation layer 105 is formed on the surface of substrate 101. In an embodiment, first passivation layer 105 is $SiO_x$ or $Si_xN_y$. Passivation may be achieved by any suitable process, such as chemical vapor deposition (CVD) or thermal growth. First passivation layer 105 is of a thickness sufficient to prevent the nucleation of Group III-Nitride on substrate 101, typically 10-60 nm.

Figure 5C:
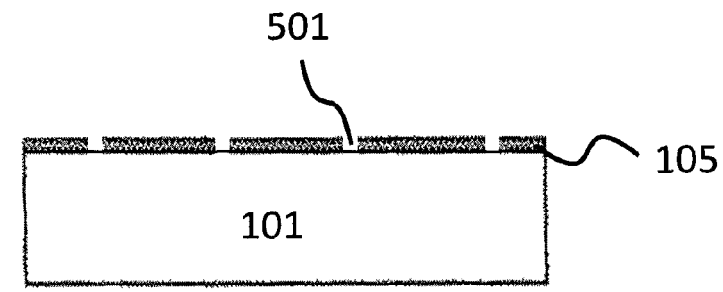
Figure 5D:
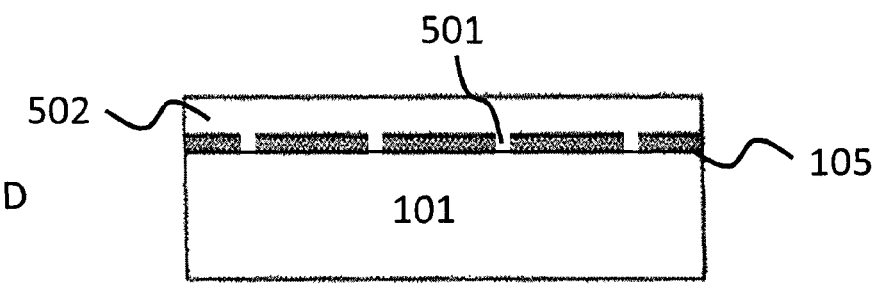

In FIG. 5C, windows 501 are etched through the first passivation layer 105. Windows 501 are sized and spaced to enable the nucleation of an epitaxial layer 502 grown above the first passivation layer 105, as shown in FIG. 5D. Windows 501 can be formed by any suitable technique, such as by masking portions of first passivation layer 105 and then etching the exposed portions of first passivation layer 105 with, for example, a wet etchant. In an embodiment, a window 501 is 1-100 μm wide in the x/y dimension.

In FIG. 5D, epitaxial layer 502 is grown over the first passivation layer 105. Growth may occur by any suitable process, such as but not limited to HVPE, MOCVD, or MBE. In an embodiment, growth is nucleated on the substrate 101 via window 501 cut through first passivation layer 105, so that the crystallographic orientation of epitaxial layer 502 is the same as that of substrate 101. For example, if substrate 101 is (100) Si, and epitaxial layer 502 is grown through window 501, then epitaxial layer 502 will be also (100) Si. As an alternative example, if substrate 101 is offcut (100) Si, then epitaxial layer 502 grown through windows 501 will also be offcut (100) Si.

In embodiments of the invention where patterned features are designed to allow coalescence of the Group III-Nitride layers formed on the patterned feature sidewalls, epitaxial layer 502 has a thickness of 1-4 μm in the z-direction. In embodiments of the invention where individual Group III-Nitride layers will be formed without coalescence, epitaxial layer 502 has a thickness of 25-75 μm in the z-direction.

Figure 5E:
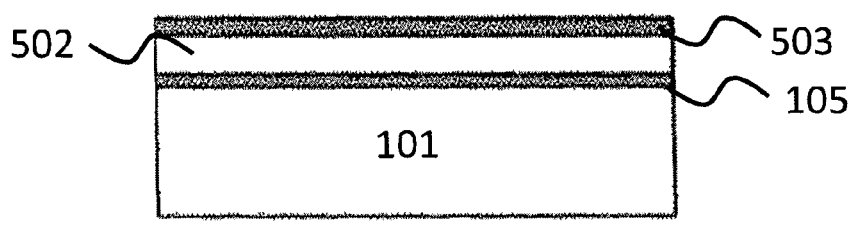

In FIG. 5E, second passivation layer 503 is formed on the surface of epitaxial layer 502, according to an embodiment of the invention. Second passivation layer 503 may be formed by any suitable process, such as CVD or thermal growth. Second passivation layer 503 is of a material and thickness sufficient to prevent the nucleation of Group III-Nitride on the underlying epitaxial layer 502. Second passivation layer 503 is typically 10-60 nm.

Figure 5F:
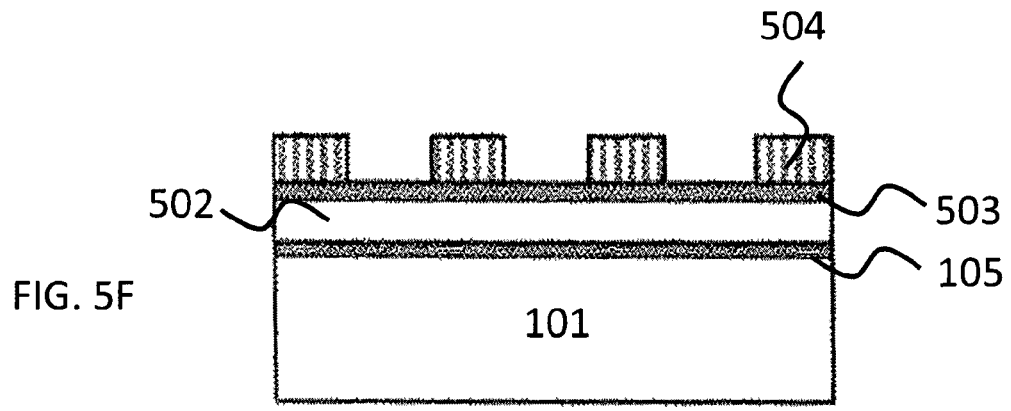

In FIG. 5F, mask 504, such as a photoresist mask, has been formed on the surface of second passivation layer 104. Any suitable process may be used to form mask 504, such as photolithography. Mask 504 is oriented on the surface of second passivation layer 104 with respect to the crystallographic orientation of the underlying epitaxial layer 502, so that the subsequent etching step exposes selected crystallographic planes in epitaxial layer 502. The exposed crystallographic planes are selected to enable growth of a Group III-Nitride film with the desired surface orientation.

Figure 5G:
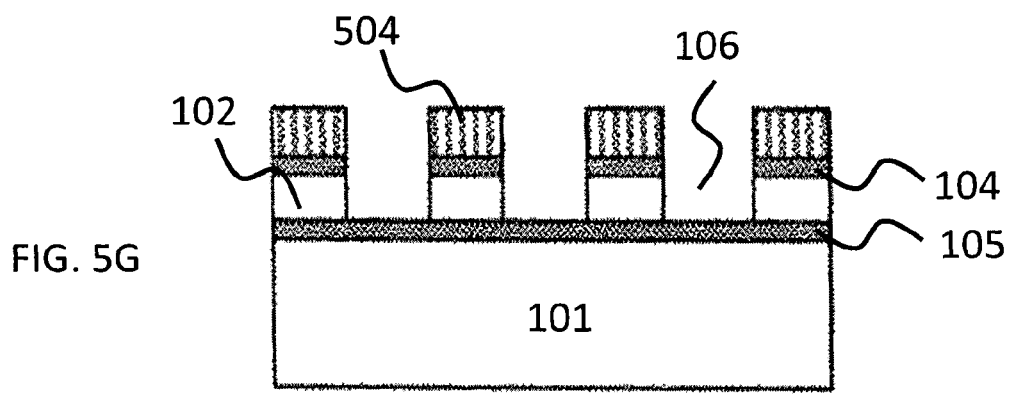

In FIG. 5G, second passivation layer 506 is etched to form top passivation layer 104, and epitaxial layer 502 is etched to form trench 106 and patterned feature 102. In an embodiment, trench 106 extends through epitaxial layer 502 to first passivation layer 105. The combination of mask 504 and the etching process determines the cross-sectional shape of patterned feature 102.

Figure 5H:
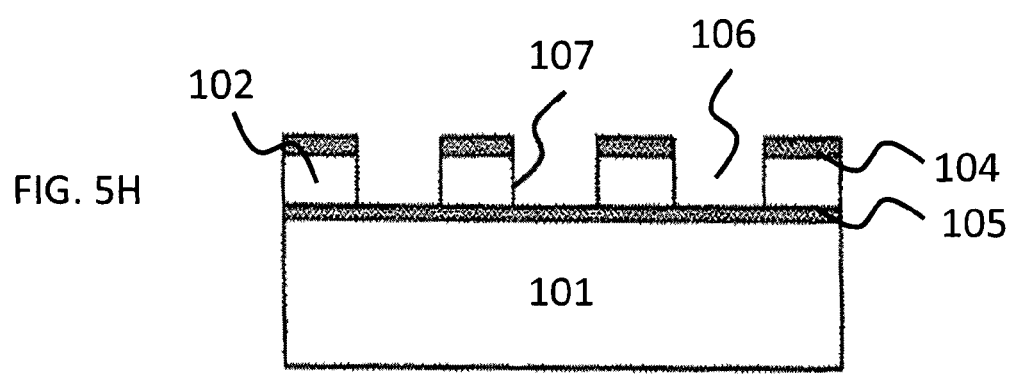

In FIG. 5H, mask 504 has been removed. In embodiments of the invention, such as those shown in FIGS. 1A and 4C, patterned feature 102 has dimensions designed to allow the coalescence of Group III-Nitride films that are nucleated on elongated sidewalls 107. In such an embodiment, patterned features 102 have a width of 1-4 µm, height of 1-4 82 m, and length of 100-400 µm. Typically, patterned features 102 will have a width of 1 µm, a height of 1 µm, and a length of 300 µm. Neighboring patterned features 102 are spaced 1-4 µm apart.

In other embodiments of the invention, such as those shown in FIGS. 1B and 4D, patterned features 102 have dimensions that are selected to enable deposition of a plurality of individual Group III-Nitride films, while allowing additional space for deposition of additional device layers between patterned features 102. In an embodiment, patterned features 102 have a width of 25-75 µm, height of 25-75 µm, and length of 100-400 µm. Typically, patterned features 102 will have a width of 50 µm, a height of 50 µm, and a length of 300 µm. Neighboring patterned features 102 are spaced 100-400 µm apart.

In embodiments where patterned features 102 are formed from an epitaxial layer 502, patterned features 102 have the same orientation as substrate 101. In embodiments of the invention, patterned features 102 have an orientation of (100), (110), or (111). In embodiments of the invention where substrate 101 is offcut, patterned features 102 are also offcut.

Figure 6B:
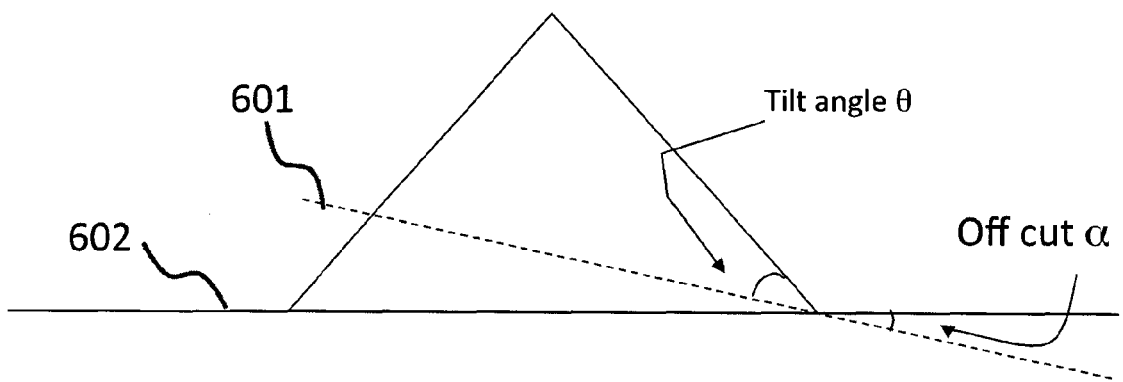
FIG. 6B illustrates a cross-sectional view of an embodiment of a patterned feature with a triangular cross-section. Offcut angle $\alpha$ and tilt angle $\theta$ are indicated for an offcut substrate.
Figure 6C:
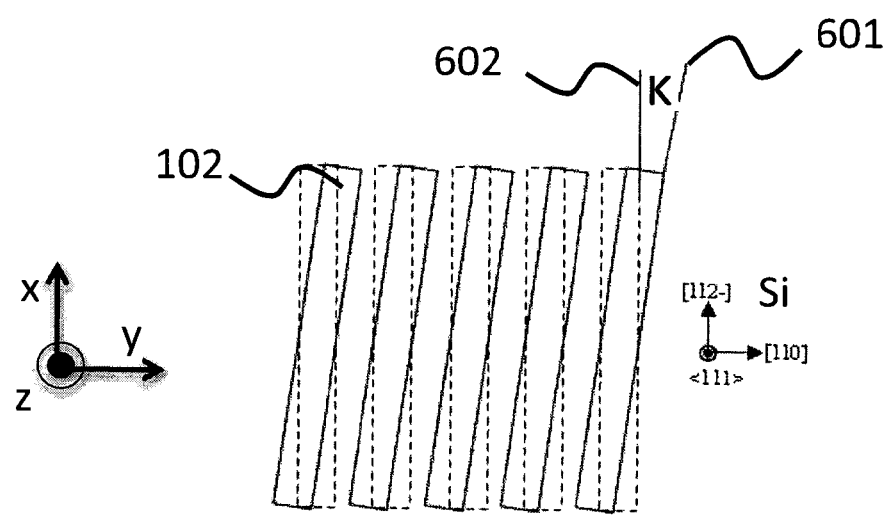
FIG. 6C illustrates an overhead view of a plurality of patterned features with offcut sidewalls.

In an embodiment, elongated sidewalls 107 have a uniform (111)Si, (100)Si, or (110)Si orientation. In other embodiments, elongated sidewalls 107 are offcut by offcut angle κ to create a vicinal surface, as shown in FIG. 6C. A vicinal surface, which is one that is off-cut from the standard crystallographic planes, provides microscopic surface steps that act as island nucleation sites. These sites influence the interfacial surface energy of the Group III-Nitride film grown from them, and also improve grain alignment for better crystal quality and a smoother Group III-Nitride film surface. In FIG. 6C, the physical surface 601 of elongated sidewall 107 deviates from the surface of the crystallographic plane 602 by offcut angle κ, which, in an embodiment, ranges from 0.1 to 10 degrees. Typically, offcut angle κ is 2 degrees.

In an embodiment of the invention, elongated sidewalls 107 are oriented vertically, forming a substantially 90-degree angle with the surface of substrate 102 when viewed in cross-section. In other embodiments of the invention, elongated sidewalls 107 are tilted to form an angle with the substrate surface that is less than 90 degrees when viewed in cross-section.

Figure 7:
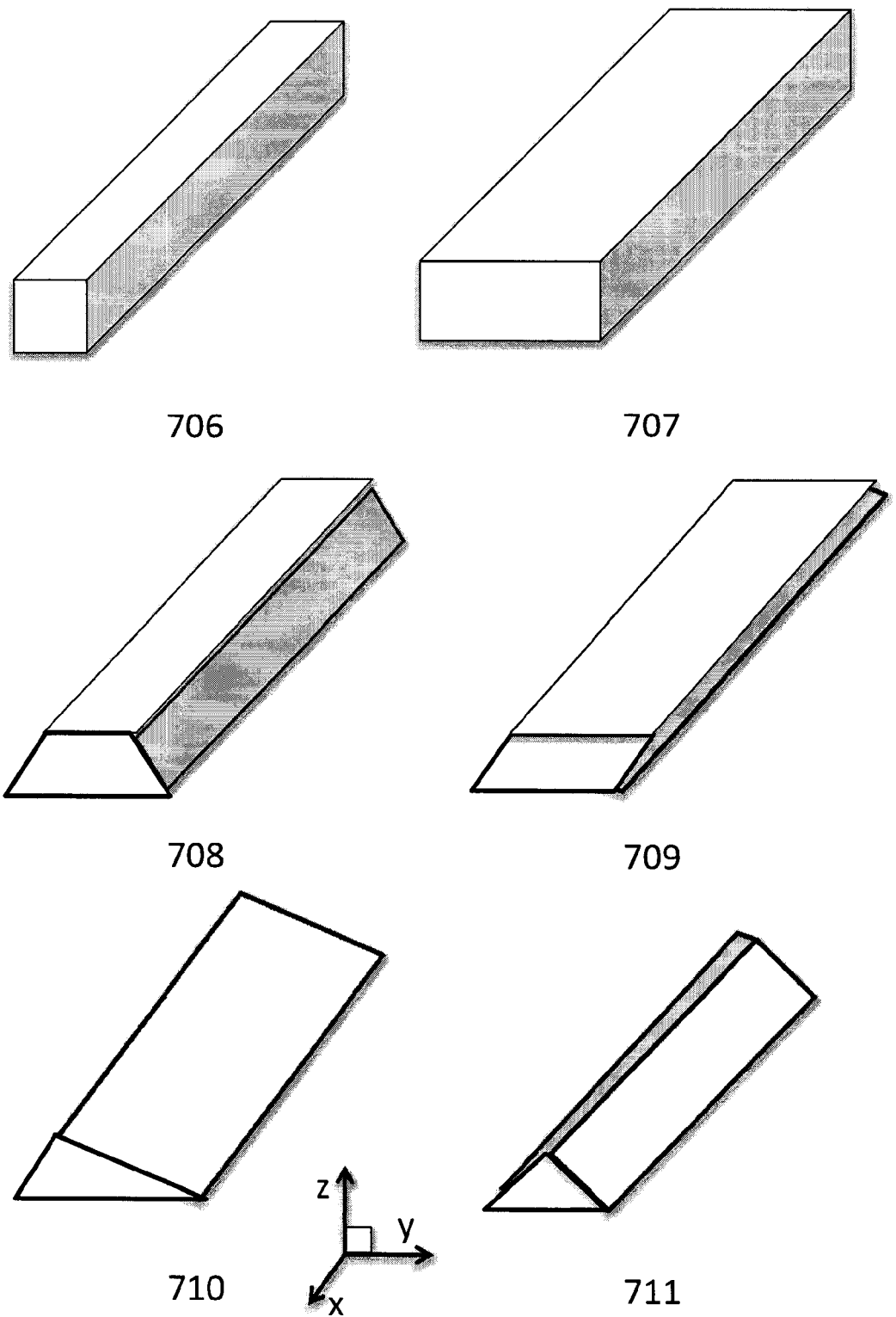
FIG. 7 illustrates three-dimensional perspective views of alternative embodiments of a patterned feature.

FIG. 7 illustrates three-dimensional perspective views of different embodiments of a patterned feature 102. The cross-sectional shape of patterned features 102 may be any shape that provides at least one sidewall suitable for growth of a Group III-Nitride with a desired surface orientation. Examples of such cross-sectional shapes include square 706, rectangle 707, trapezoid 708, parallelogram 709, and triangles 710 and 711. Different cross-sectional shapes are achieved by any suitable method, such as selective wet-etch. Other cross-sectional shapes with varying numbers of facets may be used.

In an embodiment where elongated sidewalls 107 are tilted, the crystallographic orientation of elongated sidewalls 107 corresponds to a uniform crystallographic plane. In another embodiment, the crystallographic orientation of elongated sidewalls 107 is offcut from a crystallographic plane. FIG. 6B shows a cross-sectional view of an embodiment of a patterned feature with tilted sidewalls and a triangular cross-section on an offcut substrate. The angle between the physical substrate surface 601 and the surface of the crystallographic plane 602 is offcut angle α; tilt angle θ is also indicated.

Figure 5I:
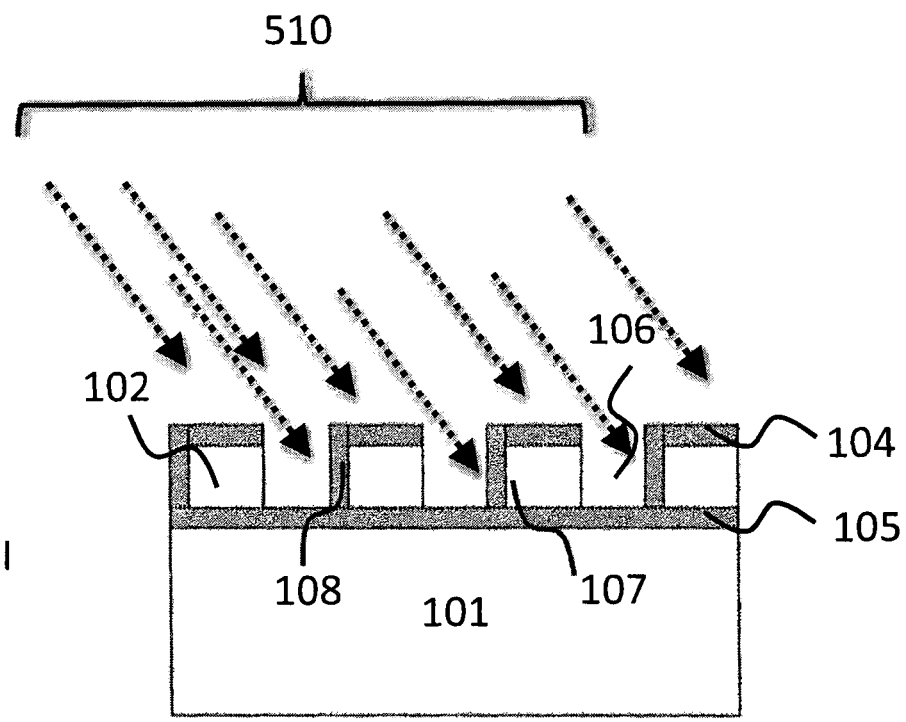

In FIG. 5I, optional sidewall passivation layers 108 are formed on one elongated sidewall 107 each of a patterned feature 102. Forming sidewall passivation layer 108 on one of the two elongated sidewalls 107 of each patterned feature 102 can be achieved through any suitable process. In one embodiment of the process, a mask is used to protect one elongated sidewall 107 while a passivation layer is formed on the opposing, exposed sidewall via CVD or surface treatment. In another embodiment of the passivation process, high-angle implantation 510 is used to form sidewall passivation layer 108 on elongated sidewall 107.

Forming a passivation layer on one or more selected elongated sidewalls 107 prevents nucleation and growth of Group III-Nitride from any elongated sidewall 107 on which a sidewall passivation layer 108 has been formed. Similarly, first passivation layer 105 prevents growth of Group III-Nitride on the bottom surface of trench 106 and top passivation layer 104 prevents growth on the top surface of patterned feature 102. This method enables selective deposition of the Group III-Nitride film only on exposed elongated sidewalls 107 that have a crystallographic orientation that will allow nucleation of the desired orientation of the Group III-Nitride film. It also enables the selection of sidewalls for nucleation so that growth will have a lateral component, which is required to exploit the dislocation bending phenomena that can reduce threading dislocation density in the bulk of the film in accordance with an embodiment of the invention.

Figure 5J:
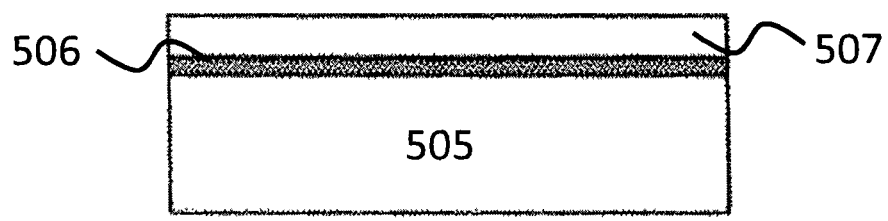

In an alternative embodiment of the patterning process shown in FIGS. 5A-5I, the steps shown in FIGS. 5A-5D are not performed, and instead compound substrate 508 is provided, as shown in FIG. 5J. Compound substrate 508 comprises base substrate 505, substrate passivation layer 506, and top substrate 507. Compound substrate 508 may be formed by any method known in the art, such as wafer bonding.

In one embodiment, compound substrate 508 is a silicon-on-insulator (SOI) substrate. In an embodiment, base substrate 505 is single-crystal silicon and has an orientation of (100), (110), (111), or any offcut Si plane. Alternatively, base substrate 505 is polycrystalline or amorphous Si. In another embodiment, base substrate 505 is sapphire. Top substrate 507 is single-crystal silicon and has an orientation of (100), (110), or (111) in an embodiment. In another embodiment, top substrate 507 is single crystal silicon that has been offcut from a crystallographic plane as shown in FIGS. 6A-6B. In another embodiment, top substrate 507 is monocrystalline sapphire and has an orientation of (0001), (112-0), or (101-0). In another embodiment, top substrate 507 is monocrystalline sapphire that has been offcut from a crystallographic plane as shown in FIGS. 6A-6B. In an embodiment, base substrate 505 and top substrate 507 are both single-crystal Si and have the same crystallographic orientation. In another embodiment, base substrate 505 and top substrate 507 are both monocrystalline sapphire and have the same crystallographic orientation. In other embodiments, base substrate 505 and top substrate 507 have different crystallographic orientations. In other embodiments, base substrate 505 is polycrystalline or amorphous and top substrate 507 is monocrystalline. The orientation of top substrate 507 is selected to allow patterning of features that can support growth of the desired orientation of Group III-Nitride film.

In embodiments of the invention where patterned features are designed to allow coalescence of the Group III-Nitride films formed on the patterned feature sidewalls, top substrate 507 has a thickness of 1-4 µm. In embodiments of the invention where individual Group III-Nitride films will be formed without coalescence, top substrate 507 has a thickness of 25-75 µm.

SOI substrate 508 is provided and patterned according to the process shown in FIGS. 5E-5I, beginning with the formation of second passivation layer 503 on the surface of top substrate 507, according to embodiments of the invention.

An embodiment of the Group III-Nitride film deposition process is shown in FIGS. 8A-F, wherein a non-polar or semi-polar, single crystal Group III-Nitride film is formed. Although the method of the present invention is described with respect to a preferred method of forming a single-crystalline gallium nitride (GaN) film on a silicon substrate, the teaching described herein is equally applicable to other Group III-Nitrides including but not limited to indium nitride (InN), and aluminum nitride (AlN), as well as ternary Group III-Nitrides such as AlGaN, InGaN, and InAlN and quarternary Group III-Nitrides such as InGaAlN. In addition, other embodiments use other substrate materials, such as sapphire.

Figure 8A:
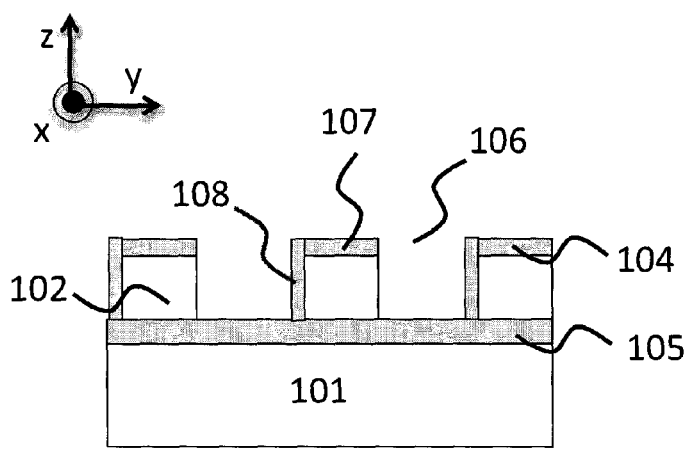
FIGS. 8A-8F illustrate a method of forming a single-crystalline coalesced non-polar or semi-polar Group III-Nitride film with a desired orientation on a patterned features with either vertical or tilted sidewalls according to an embodiment of the invention.
Figure 8A:
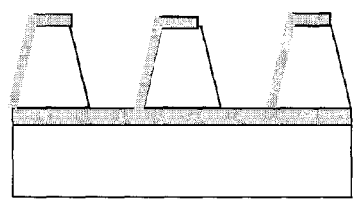

In FIG. 8A, a patterned silicon substrate is provided. The patterned substrate comprises base substrate 101, first passivation layer 105 on top of base substrate 101, patterned features 102 on top of first passivation layer 105, trenches 106 between the patterned features 102, and top passivation layer 104 on top of each patterned feature 102 according to an embodiment of the present invention. Each patterned feature 102 has elongated sidewalls 107. Elongated sidewalls 107 may be substantially vertical or tilted with respect to substrate 101, as shown in the embodiments of FIG. 8A. In an embodiment, sidewall passivation layers 108 cover one of the two elongated sidewalls 107 defining trench 106. The patterned substrates shown in FIG. 8A are formed by the method described above and shown in FIGS. 5A-5I according to an embodiment of the invention. Alternatively, the patterned substrates shown in FIG. 8A may have been formed by another method.

Figure 9A:
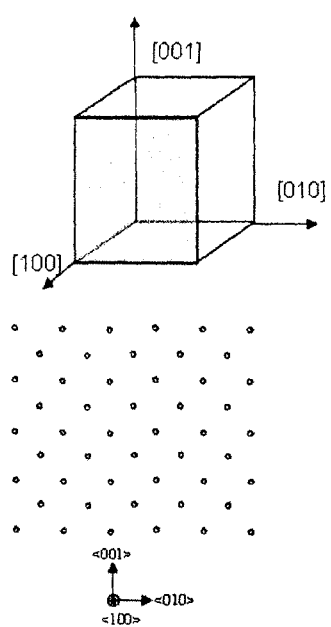
FIGS. 9A-9C are illustrations of the crystal structure of silicon.
Figure 9B:
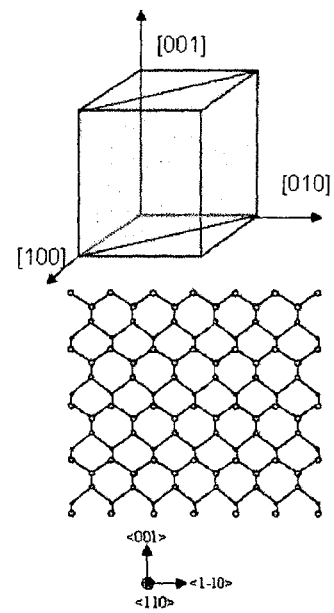
Figure 9C:
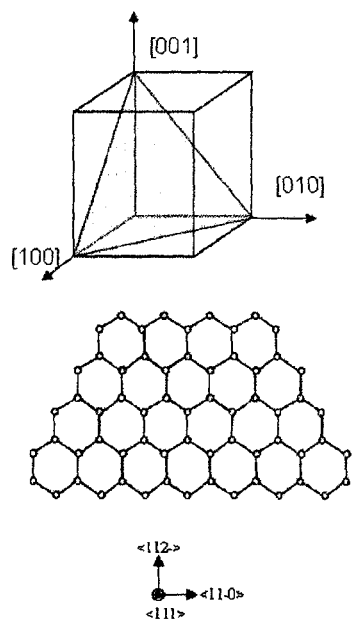
Figure 10:
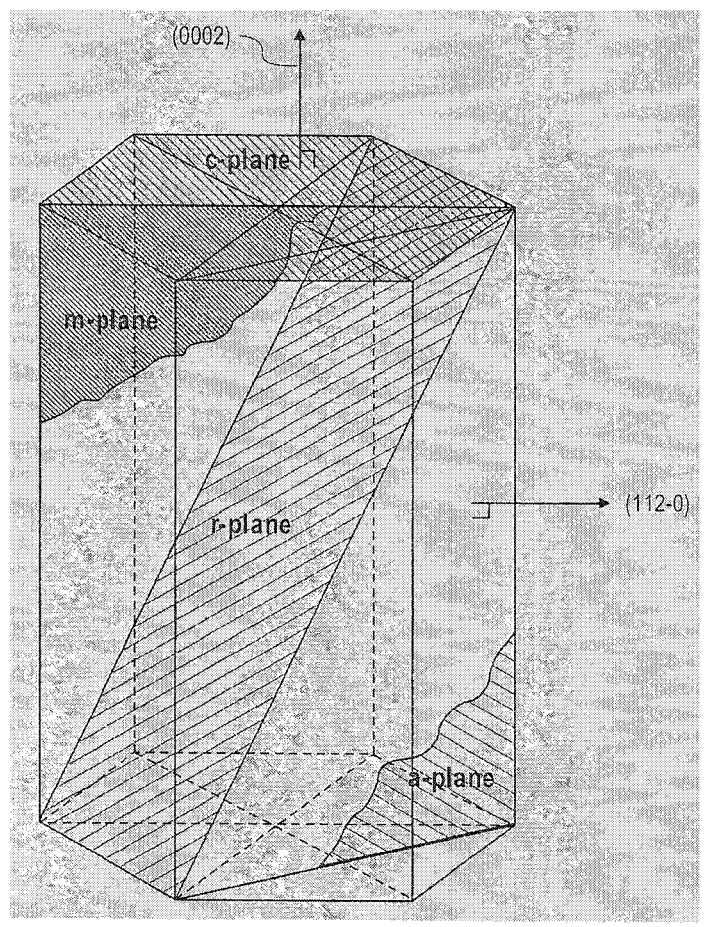
FIG. 10 is an illustration of the crystal structure of a Group III-Nitride.

The crystallographic orientation of substrate 101 and patterned features 102 is selected to enable growth of GaN with a desired orientation in the z-direction. Silicon has a diamond cubic crystal structure, as shown in FIGS. 9A-9C. FIG. 9A shows the location and atomic arrangement of the (100) plane, FIG. 9B shows the (110) plane, and FIG. 9C shows the (111) plane. GaN has a wurtzite crystal structure, as illustrated in FIG. 10. FIG. 10 identifies the locations of the c-plane, m-plane, a-plane, and r-plane in a wurtzite structure.

Figure 11A:
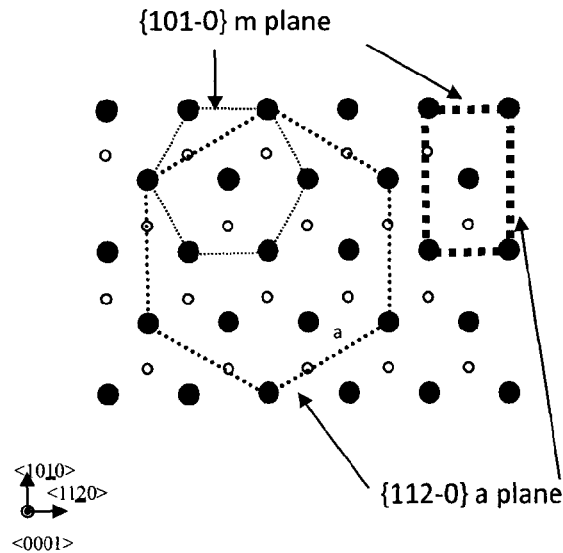
FIGS. 11A-11B show the complementary crystal planes of a Group III-Nitride and silicon.
Figure 11A:
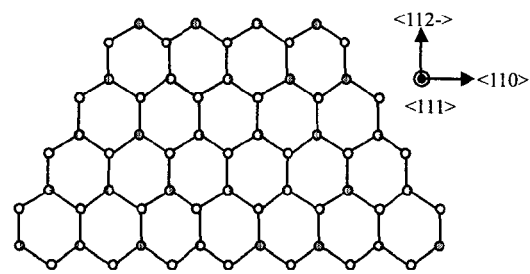
Figure 11B:
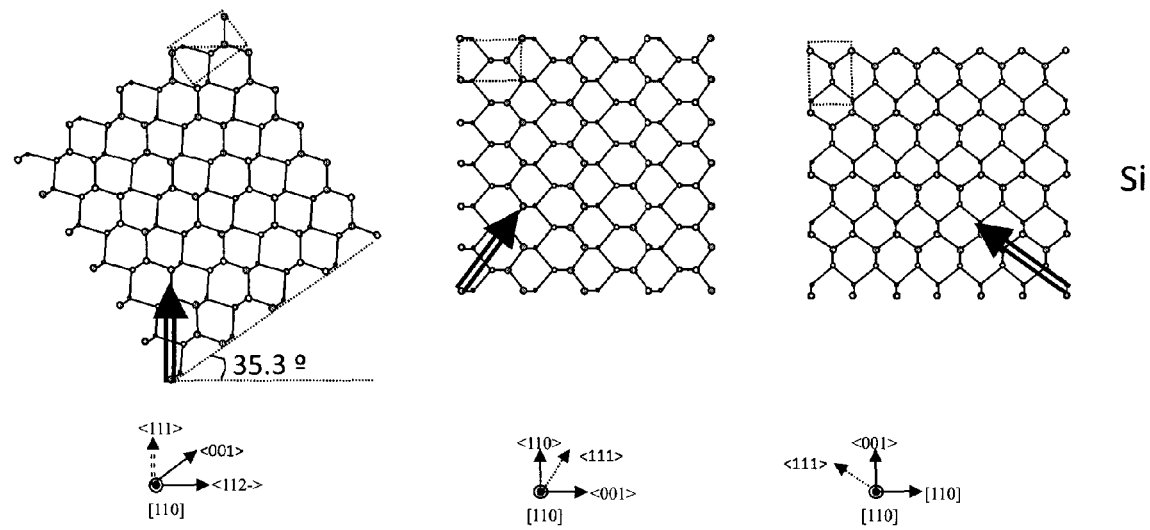
Figure 11B:
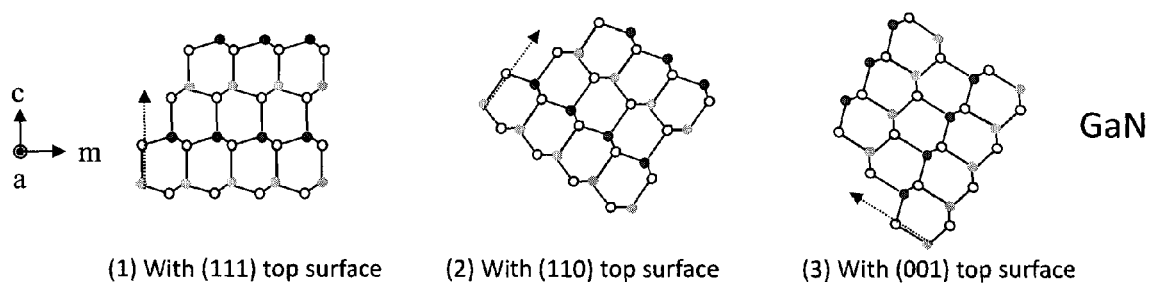
Figure 11B:
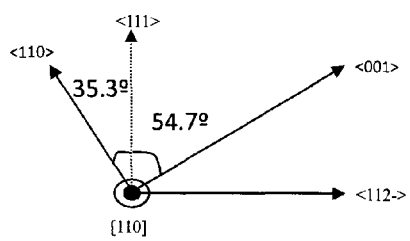

The crystallographic symmetry and the lattice constant of a plane determine which materials are compatible to support epitaxial growth. FIGS. 11A-11B illustrate examples of complementary planes for GaN and Si. C-plane/(0001) GaN, shown in FIG. 11A, has six-fold symmetry. While (111) Si has three-fold symmetry, a "pseudo" six-fold symmetry with the atoms beneath the surface due to the roughly hexagonal arrangement of atoms can support the epitaxial growth of (0001) GaN. Non-polar A-plane/(112-0) GaN is shown in FIG. 11B. The (110) Si plane can enable the growth of A-plane/(112-0) GaN with the (0002) c-axis of GaN aligned with the <111> direction of Si.

Figure 12A:
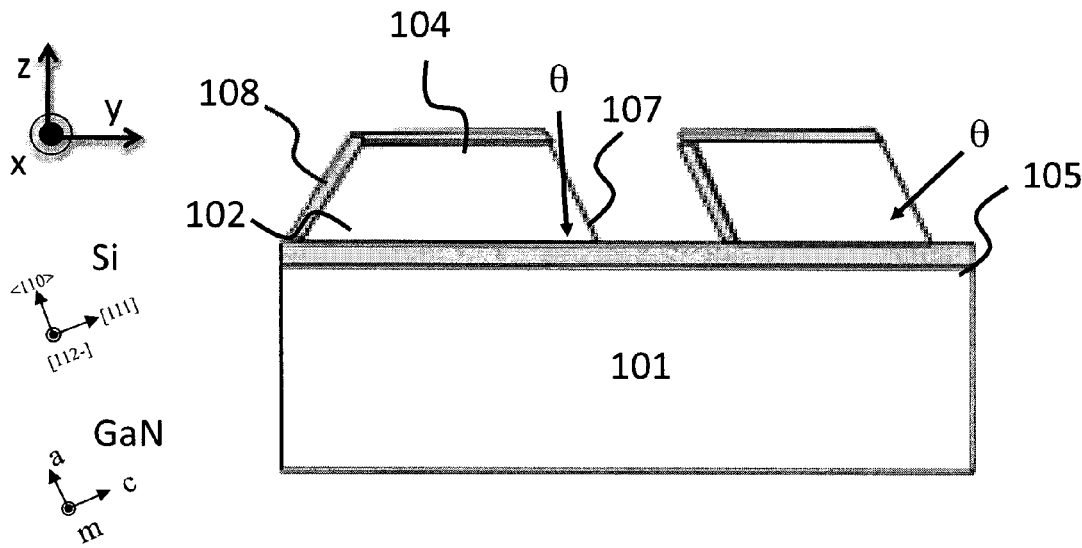
FIGS. 12A-12D illustrate alternative embodiments of the method described in FIGS. 8A-8F.
Figure 12A:
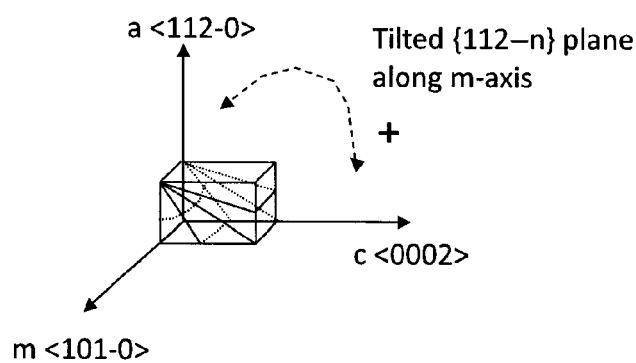

FIGS. 12A-12D illustrate specific embodiments of the process shown in FIGS. 8A-8F. In the embodiment of the invention shown in FIG. 12A, substrate 101 is (110) Si and patterned features 102 are patterned along the <112-> direction to form elongated sidewalls 107 with a (111) orientation. (111) Si sidewalls are desired to enable the nucleation of c-plane/(0001) GaN, as shown in FIG. 11A. Tilt angle θ, measured between the (111) Si plane forming elongated sidewall 107 and the (110) surface of silicon substrate 101, is 90 degrees in this embodiment, causing elongated sidewalls 107 to be vertically oriented. In another embodiment, substrate 101 is offcut (110) Si (see FIGS. 6A-6B), and patterned features 102 are patterned along the <112-> direction. Offcutting substrate 101 by offcut angle a decreases tilt angle θ between the (111) surface of elongated sidewall 107 and the substrate 101 surface to less than 90 degrees, causing elongated sidewall 107 to be tilted. Table 1207 of FIG. 12A shows the relationship between offcut angle a and tilt angle θ for embodiments of the invention. In embodiments of the invention, offcut angle a ranges from 0 to 42.7 degrees, and tilt angle θ ranges from 90 to 47.3 degrees.

Figure 12B:
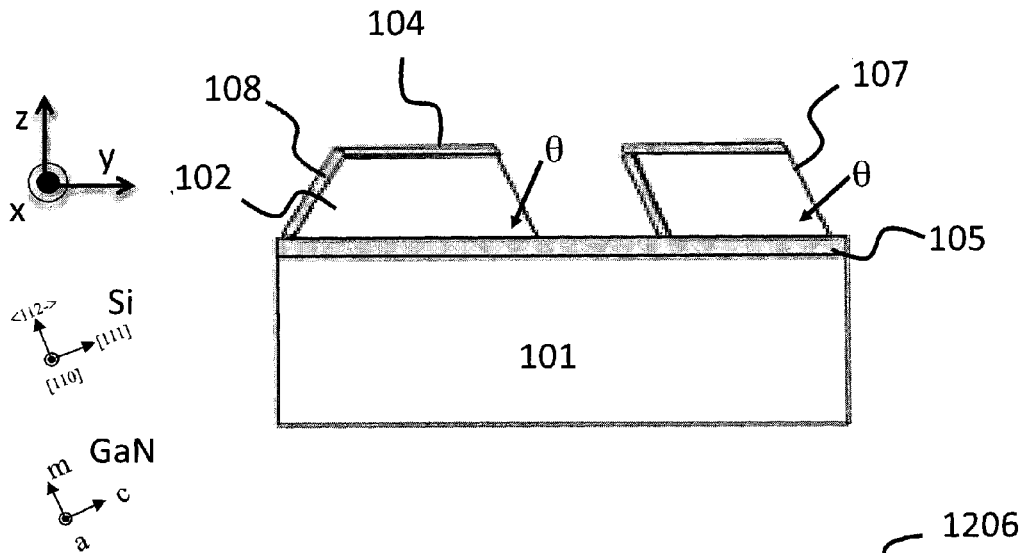
Figure 12B:
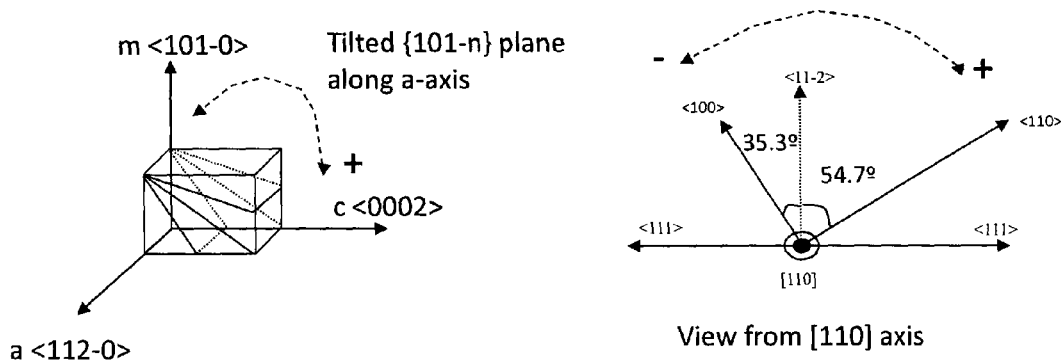

In another embodiment, shown in FIG. 12B, substrate 101 is (112-), (110), or (100) Si. The patterned features 102 are patterned along the <110> direction to form elongated sidewalls 107 with a (111) orientation. (111) Si sidewalls are desired to enable the nucleation of c-plane/(0001) GaN, as shown in FIG. 11A. The tilt angle θ of the elongated sidewalls 107 can be vertical to the surface of the substrate 101 in the case of (112-) Si substrate. Because the (111) Si planes form a 54.7-degree angle with the (100) Si plane, elongated sidewalls 107 are sloped, forming a tilt angle θ of 54.7 degrees with the surface of substrate 101. (111) Si has 35.3-degree angle with (110) Si plane, the tilt angle is 35.3 degree when (110) Si substrate is used. In another embodiment, substrate 101 is offcut (100) Si, (110) Si, or (112-) Si. The patterned features 102 are patterned in the <110> direction. The relationship between offcut angle a of substrate 101 and tilt angle θ is shown in Table 1206 of FIG. 12B. For the tilt angle θ ranges from 90 to 32 degrees, the offcut angle α ranges from 0 to 58 degrees with respect to the (112-) Si plane, from −54.7 to 3.3 degrees with respect to the (110) Si plane, and from 35.3 to −22.7 degrees with respect to the (100) Si plane.

Figure 12C:
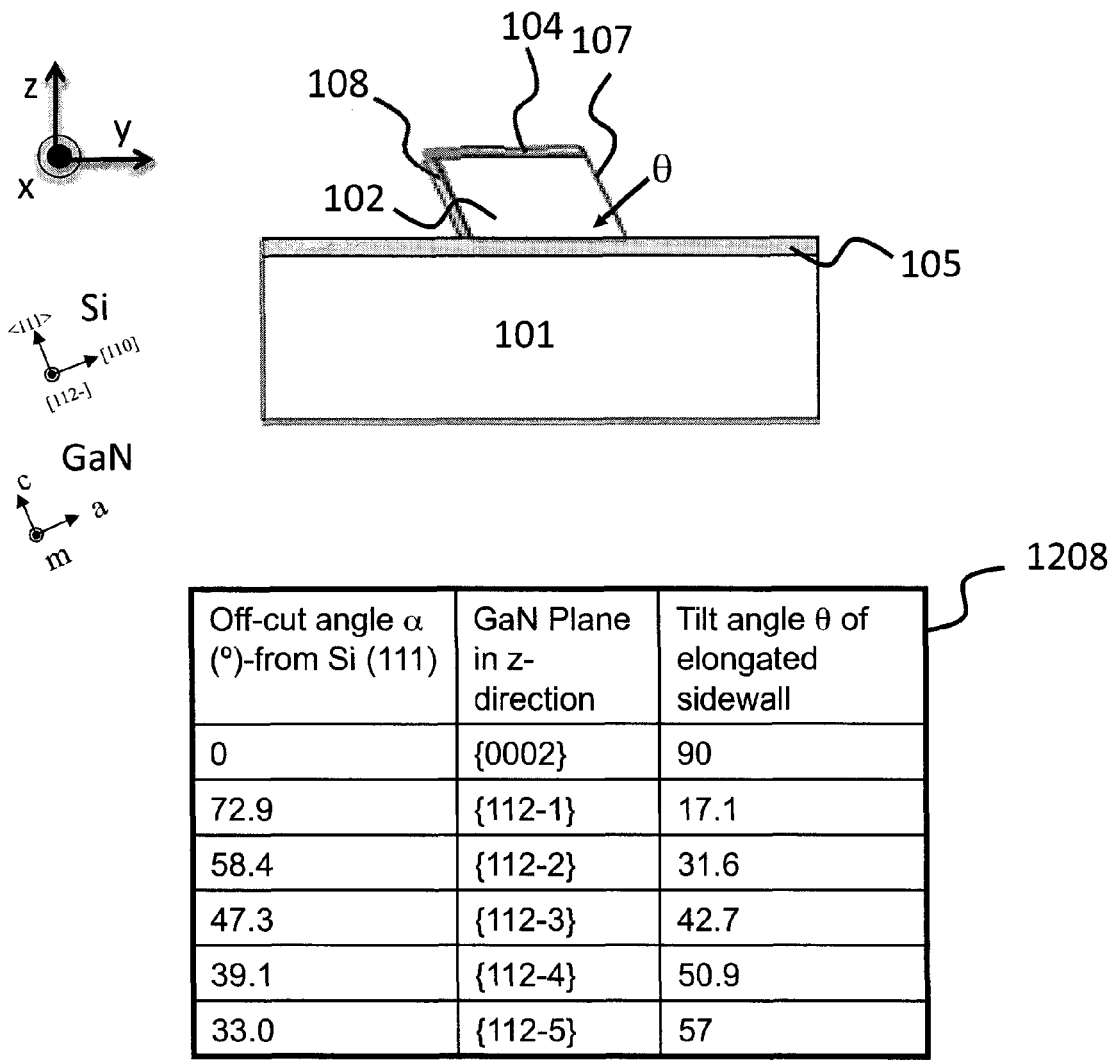
Figure 12C:
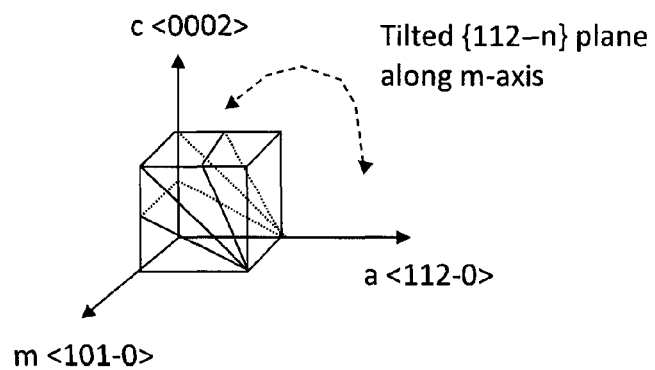

In another embodiment, shown in FIG. 12C, substrate 101 is (111) Si and patterned features 102 are patterned along the <112-> direction to from elongated sidewalls 107 with a (110) orientation. (110) Si sidewalls are desired to enable the nucleation of a-plane/(112-0) GaN, as shown in FIG. 11B. In this embodiment, the (110) Si plane of elongated sidewall 107 forms a 90-degree tilt angle θ with the (111) plane of substrate 101, and elongated sidewalls 107 are vertically oriented. In an alternative embodiment, substrate 101 is offcut (111) Si (see FIGS. 6A-6B). Offcutting the substrate decreases tilt angle θ to less than 90 degrees. The relationship between offcut angle α and tilt angle θ is shown in Table 1208 of FIG. 12C. Offcut angle α, with respect to the (111) Si plane, ranges from 0 to 33 degrees, and tilt angle θ ranges from 90 to 17.1 degrees.

Figure 12D:
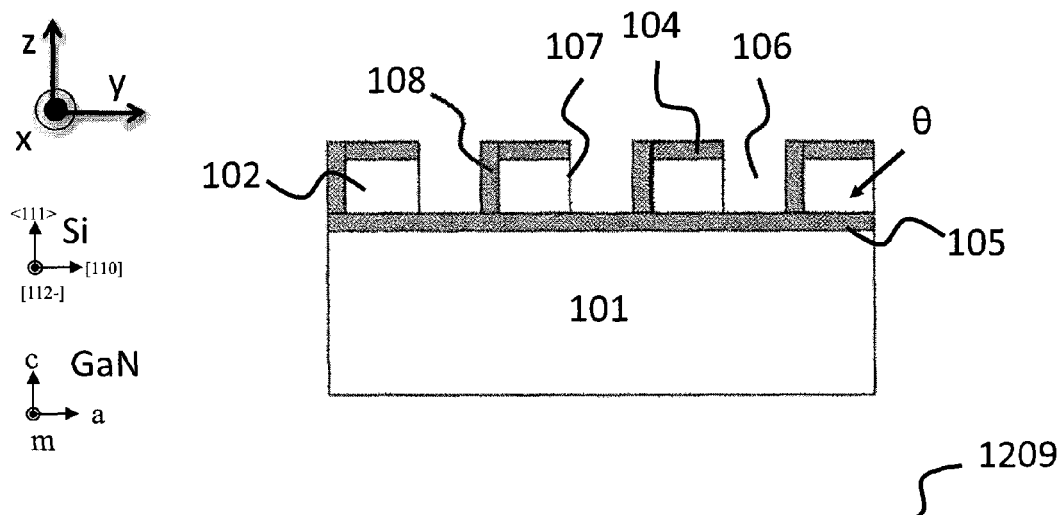
Figure 12D:
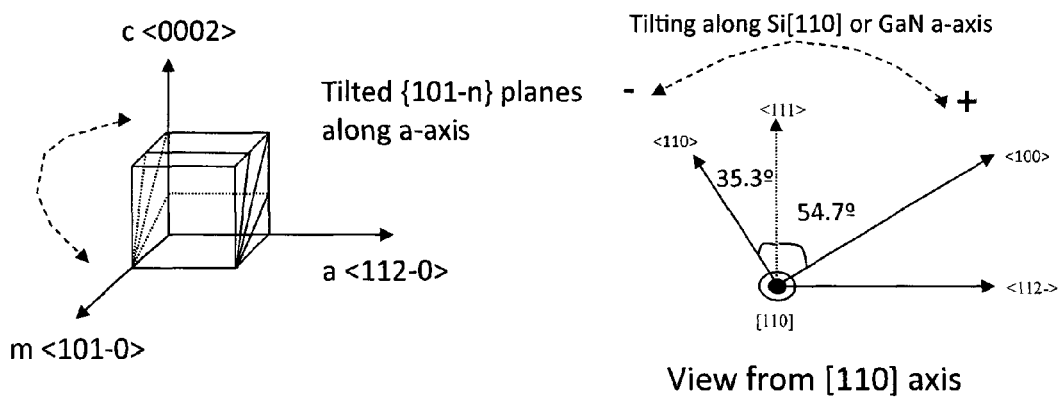

In another embodiment, shown in FIG. 12D, substrate 101 is (111), (100), or (110) Si. The patterned features 102 are patterned along the <110> direction to form elongated sidewalls 107 with a (110) orientation. (110) Si sidewalls are desired to enable the nucleation of a-plane/(112-0) GaN, as shown in FIG. 11B. In this embodiment, the (110) Si plane forms a 90-degree tilt angle θ with the (100) plane of substrate 101, and elongated sidewalls 107 are vertically oriented. In an alternative embodiment, substrate 101 is offcut (111), (100), or (110) Si. In this case, the offcutting is along the [110] Si axis, and the tilt angle θ of the elongated sidewall 107 is always vertical to the surface of the substrate. The relationship between offcut angle α and resulting GaN plane (101-n) is shown in Table 1209 of FIG. 12D. Offcut angle α, with respect to the (100) Si plane, ranges from 7.3 to −54.7 degrees; with respect to the (111) Si plane, ranges from 0 to 62 degrees; with respect to the (110) Si plane, ranges from 35.3 to −26.7 degrees.

Figure 8B:
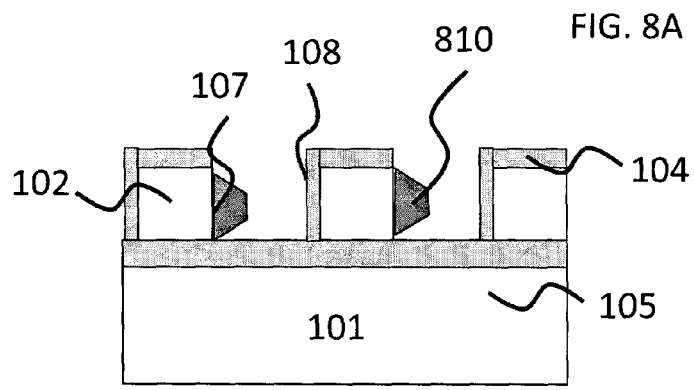
Figure 8B:
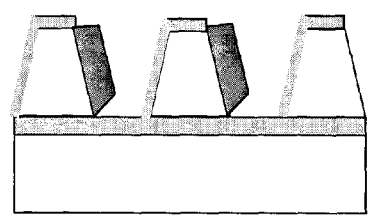

According to the embodiment illustrated in FIG. 8B, single-crystalline GaN film 810 is nucleated on the exposed elongated sidewall 107 of patterned feature 102. In an embodiment, nucleation of GaN film 810 does not occur on surfaces of patterned feature 102 that are covered by sidewall passivation layer 108, top passivation layer 104 or first passivation layer 105. In an embodiment, GaN film 810 is grown via HYPE. In other embodiments, GaN film 810 is grown via MOCVD or MBE.

According to embodiments of the invention, the orientation of elongated sidewall 107 determines the lateral direction of GaN film 810. C-plane/(0001) GaN is nucleated and grown laterally on (111) Si elongated sidewalls 107, according to embodiments of the present invention such as those shown in FIGS. 11A, 12A and 12B. Tilt angle θ determines which GaN plane is oriented in the z-direction. Table 1207 of FIG. 12A shows the relationship for an embodiment of the invention. For a tilt angle θ of 90 degrees, c-plane/(0001) GaN grows in the lateral direction, and the non-polar a-plane/(112-0) is oriented in the z-direction. For tilt angles α less than 90 degrees, semi-polar (112-n) GaN is oriented in the z-direction. For example, a tilt angle θ of 72.9 degrees corresponds to the orientation of the semi-polar (112-1) GaN plane in the z-direction. Table 1206 of FIG. 12B shows the relationship between tilt angle θ and the z-orientation of the GaN film 810 for another embodiment, wherein c-plane/(0001) GaN is grown from tilted elongated sidewall 107 and a semi-polar (101-n) GaN plane is oriented in the z-direction. For example, a tilt angle θ of 32 degrees corresponds to the orientation of the semi-polar (101-3) GaN plane in the z-direction.

In other embodiments, a-plane/(112-0) GaN is laterally grown on (110) Si elongated sidewalls 107, such as those shown in FIGS. 11B, 12C and 12D. Table 1208 of FIG. 12C shows the relationship between tilt angle θ and the z-orientation of the GaN film 810 for an embodiment of the invention. A-plane/(112-0) GaN is grown laterally with a semi-polar (112-n) plane oriented in the z-direction. For example, a tilt angle θ of 31.6 degrees corresponds to the orientation of the semi-polar (112-2) GaN plane in the z-direction. Table 1209 of FIG. 12D shows the relationship between offcut angle α and the z-orientation of GaN film 810 for another embodiment of the invention. A-plane/(112-0) GaN is grown laterally, with a semi-polar (101-n) plane oriented in the z-direction. For example, an offcut angle α of 62 degrees from (111) Si plane corresponds to the orientation of the semi-polar (101-1) plane in the z-direction.

Figure 13:
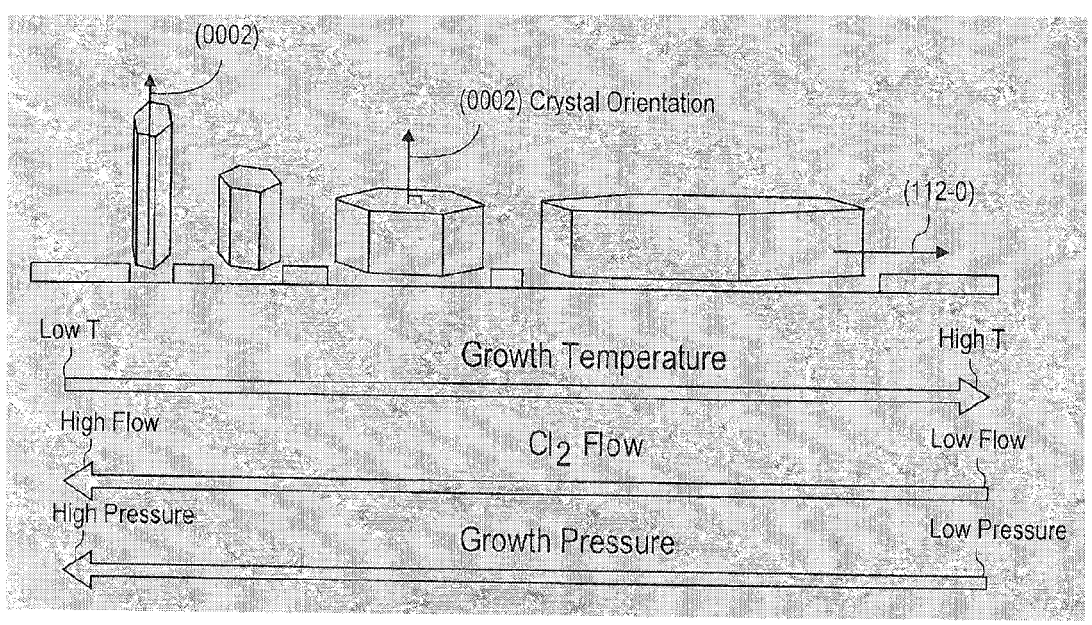
FIG. 13 is an illustration of how the deposition parameters of deposition temperature, deposition pressure, and $Cl_{-2}$ flow over a Group III source each influence the vertical and lateral HVPE growth rates of a c-plane/(0001) film.

In an embodiment, deposition conditions are initially selected to favor growth of GaN film 810 in the lateral direction, away from elongated sidewall 107. An example of deposition conditions that may be used for formation of a GaN film via HVPE is shown in FIG. 13. Low temperature and high pressure favor deposition of polar c-plane Group III-Nitride, growing in the <0001> direction. High temperature and low pressure favors deposition of non-polar a-plane and m-plane Group III-Nitride, in the <112-0> and <101-0> directions, respectively. While deposition conditions can be selected to favor growth in either the polar or non-polar directions, growth will occur in both directions.

Figure 8C:
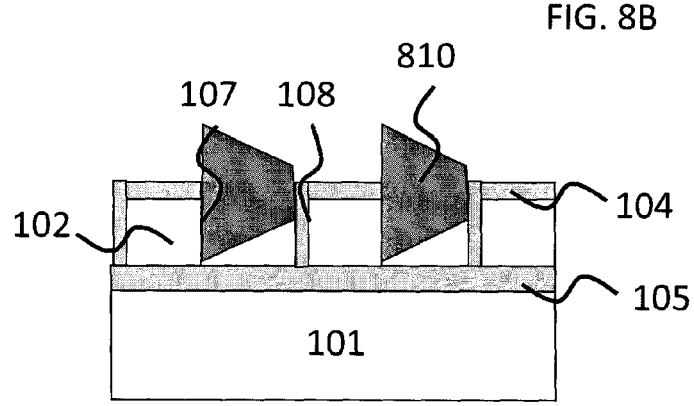
Figure 8C:
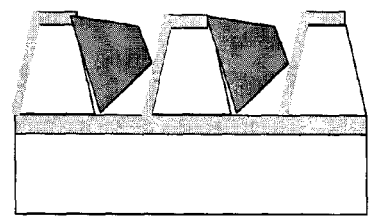
Figure 8D:
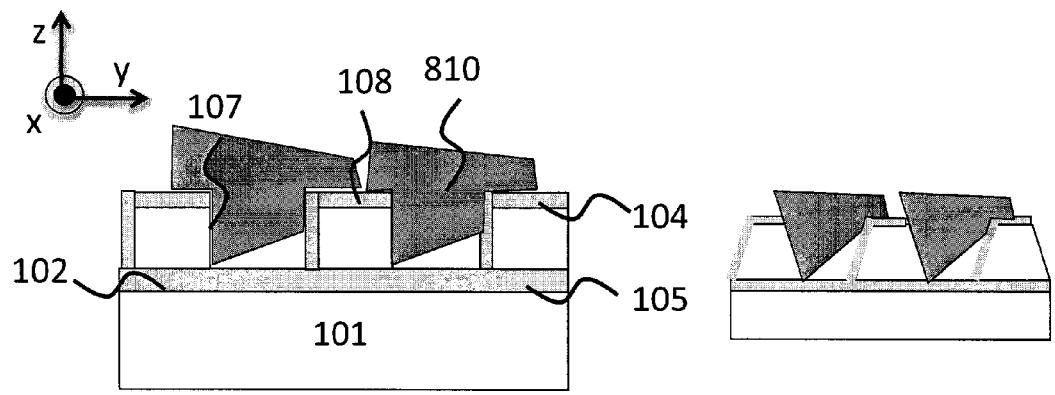
Figure 8E:
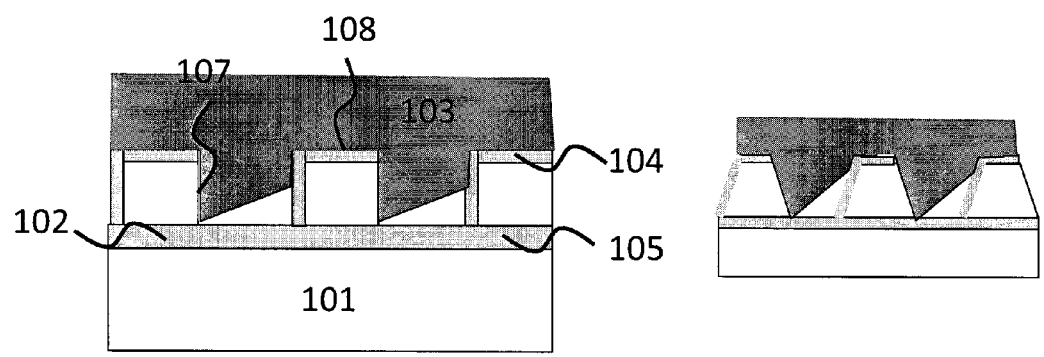

Once GaN film 810 fills trench 106, as shown by the embodiments illustrated in FIG. 8C, deposition conditions are changed to favor growth in the vertical/z-direction, out of trench 106, as shown by the embodiment in FIG. 8D. Growth conditions may then be altered to favor lateral growth over top passivation layers 104 on the patterned features 102, also shown in FIG. 8D. GaN films 810 from neighboring trenches 106 coalesce, as shown in FIG. 8E. After coalescence, deposition conditions are altered to favor growth in the vertical direction to complete growth of the single crystalline coalesced GaN film 103 with a z-direction crystallographic orientation as described above according to embodiments of the invention. Coalesced GaN films 103 grown by this process generally have a lower threading dislocation density (TDD) than films grown on a planar Si substrate. By altering the growth direction, threading dislocations intersect and annihilate, such that the TDD decreases as GaN growth continues. Thus, threading dislocations are confined close to the nucleation site, and the TDD decreases with distance from the substrate.

Figure 8F:
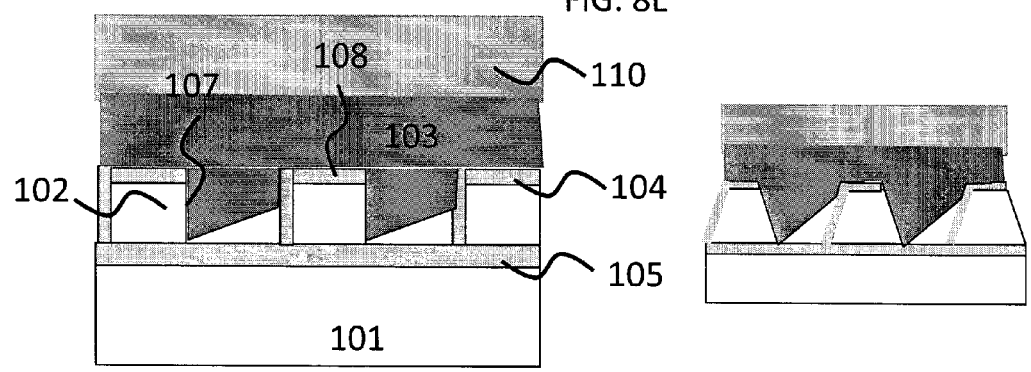

In embodiments of the present invention device layers 110, shown in FIG. 8F, contain layers used to form a semiconductor device. In a specific embodiment the device layers form light emitting diode (LED), as shown in FIG. 3A. FIG. 3A shows GaN film 103, an active region 316, an electron blocking layer 318 and a p-type contact layer 320. The active region 316 can include a single or multiple quantum wells 330, such as InGaN, formed on a single or multiple barrier layers 334, such as GaN. In one embodiment of the present invention the device layers 110 are formed by HVPE or MOCVD and insitu with the coalesced GaN film 103. In another embodiment the device layers are formed in a different chamber and by a different deposition technique than was used to form coalesced GaN film 103.

Another embodiment of the GaN deposition process is illustrated in FIGS. 14A-14G, wherein a single crystal, coalesced polar c-plane/(0001) GaN film is formed. In the embodiment shown in FIG. 14A, patterned substrate 100 is provided. In an embodiment, patterned substrate 100 is formed by the process described above and in FIGS. 5A-5H. Other processes may be used to form patterned substrate 100. First passivation layer 105 covers substrate 101. Patterned features 102 are formed on top of first passivation layer 105. Top passivation layers 104 cover the top surface of patterned features 102. Trenches 106 are between patterned features 102.

According to embodiments of the invention, substrate 101 may be silicon, such as (111) Si, (100) Si, or (110) Si. In another embodiment, substrate 101 is sapphire. In embodiments of the invention, patterned features 102 are the same orientation and material as substrate 101. In other embodiments, substrate 101 is a different material or orientation than patterned features 102.

Figure 15A:
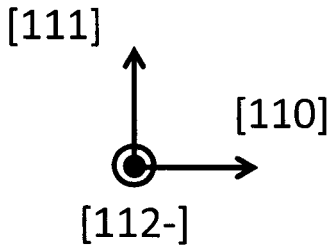
FIGS. 15A-15D illustrates alternative embodiments of the method described in FIGS. 14A-14G.
Figure 15A:
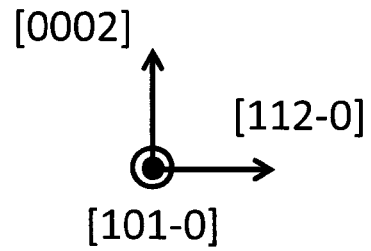
Figure 15B:
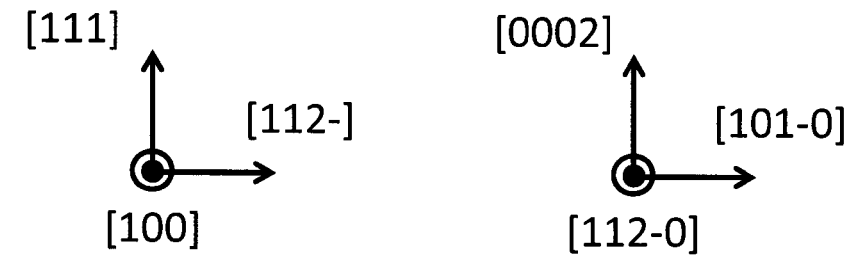
Figure 15A:
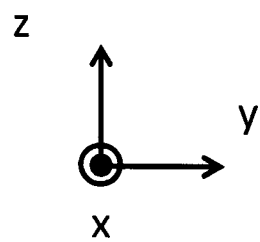

In an embodiment, (111) Si patterned features 102 are patterned along the <112-> direction to form elongated sidewalls 107 with a uniform (110) orientation, so that patterned features 102 are oriented as shown in FIG. 15A. In another embodiment, (111) Si patterned features 107 are patterned along the <110> direction to form elongated sidewalls 107 with a uniform (112-) orientation, so that patterned features 102 are oriented as shown in FIG. 15B. In another embodiment, (111) Si patterned features 102 are patterned along a direction that deviates from the <112-> direction by offcut angle κ to form patterned features 102 having elongated sidewalls 107 with an orientation offcut from the <110> direction by offcut angle κ, as shown in FIG. 6.

Figure 15C:
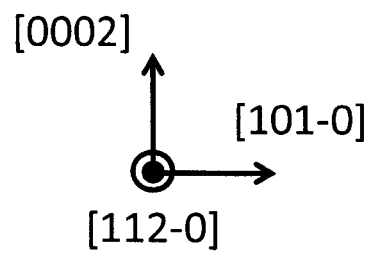
Figure 15C:
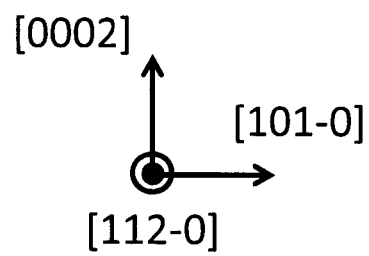
Figure 15D:
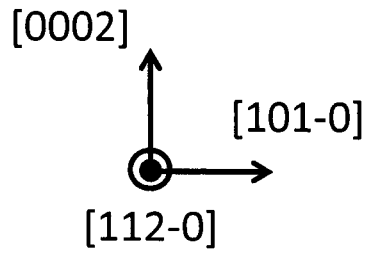
Figure 15D:
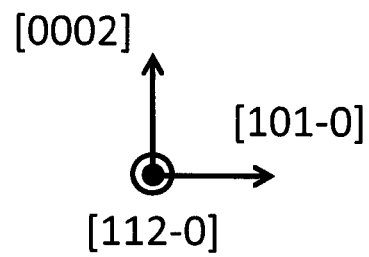
Figure 15D:
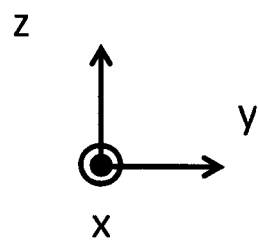

In another embodiment, sapphire (0001) patterned features 102 are patterned along the <112-0> direction to form elongated sidewalls 107 with a uniform (101-0) orientation, so that patterned features 102 are oriented as shown in FIG. 15C. In another embodiment, sapphire (0001) patterned features 102 are patterned along the <101-0> direction to form elongated sidewalls 107 with a uniform (112-0) orientation, so that patterned features 102 are oriented as shown in FIG. 15D.

Figure 14A:
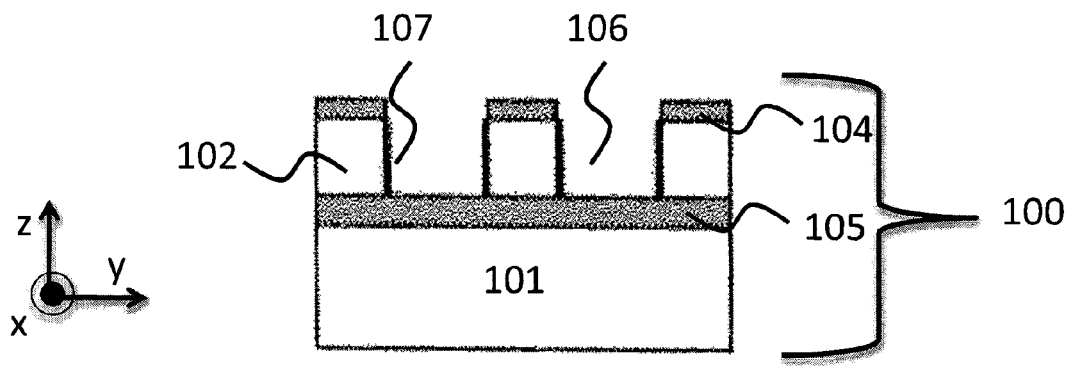
FIGS. 14A-14G illustrate a method of forming a single-crystalline coalesced polar Group III-Nitride film with a desired orientation on a patterned substrate.
Figure 14B:
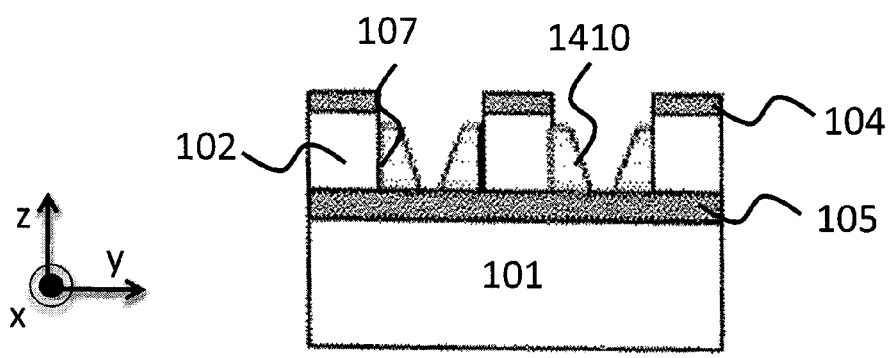

In FIG. 14B, GaN films 1410 are nucleated on elongated sidewalls 107, according to an embodiment of the present invention. GaN films 1410 may be deposited by any suitable method, such as HVPE, MOCVD, or MBE. In an embodiment, a-plane/(112-0) GaN is nucleated on (110) Si elongated sidewall 107, due to the complementary crystallographic symmetry of the planes, as shown in FIGS. 11B and 15A. The orientation of patterned features shown in FIG. 15A will orient GaN film 1410 with the (0001)/c-plane in the z-direction. In another embodiment of the invention m-plane/(101-0) GaN is nucleated on (112-) Si elongated sidewall 107 as shown in FIG. 15B. In this embodiment, the GaN film 1410 will be oriented with the (0001) c-plane in the z-direction. In another embodiment of the invention m-plane/(101-0) GaN is nucleated on (101-0) sapphire elongated sidewall 107 as shown in FIG. 15C. In this embodiment, the GaN film 1410 will be oriented with the (0001) c-plane in the z-direction. In another embodiment of the invention m-plane/(112-0) GaN is nucleated on (112-0) sapphire elongated sidewall 107 as shown in FIG. 15D. In this embodiment, the GaN film 1410 will be oriented with the (0001) c-plane in the z-direction. Deposition conditions are selected to initially favor growth of GaN in the lateral, non-polar direction. An example of conditions favorable to non-polar deposition via HVPE is shown in FIG. 13.

Figure 14C:
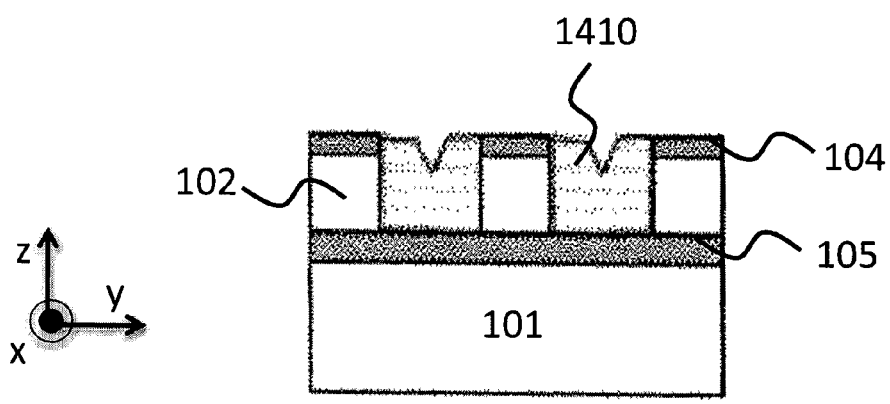
Figure 14D:
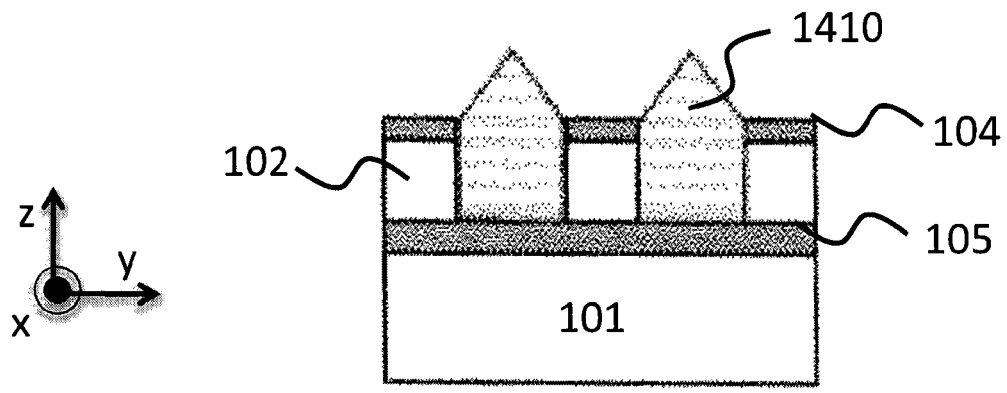

In FIG. 14C, GaN films 1410 grow laterally from adjacent elongated sidewalls 107 and coalesce at the point of intersection within the trench 106, according to an embodiment of the invention. Deposition conditions are then altered to favor vertical growth in the z-direction out of trench 106, according to the embodiment shown in FIG. 14D.

Figure 14E:
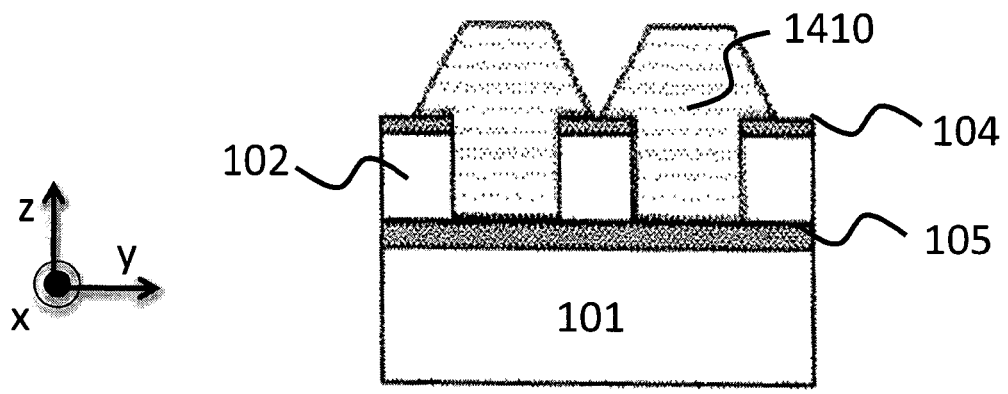
Figure 14F:
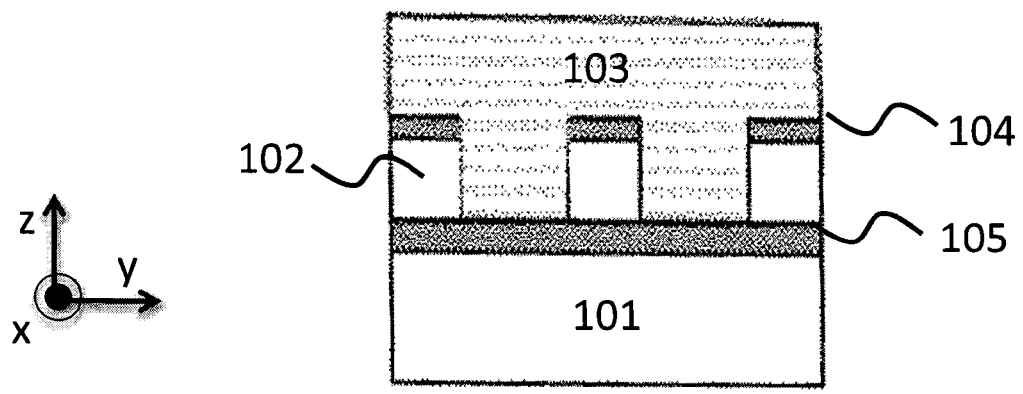

After suitable growth from trench 106, deposition conditions are altered to favor lateral growth over the top of patterned features 107 and top passivation layers 104, as shown in the embodiment illustrated in FIG. 14E.

Growths from neighboring trenches 106 coalesce over the top of patterned feature 107 and top passivation layer 104. Deposition conditions may then be altered again to favor growth in the vertical/z-direction, forming single-crystalline coalesced polar c-plane/(0001) GaN film 103, as shown by the embodiment illustrated in FIG. 14F.

Figure 14G:
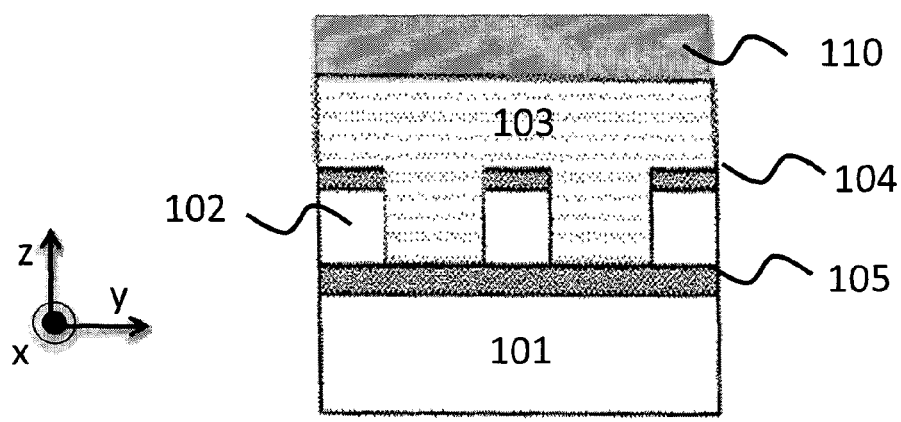

FIG. 14G illustrates an embodiment of the invention where additional device layers 110 have been formed on coalesced GaN film 103 in order to form a semiconductor device. In an embodiment, additional device layers 110 form an LED, as shown in FIG. 3A and described above.

Figure 16A:
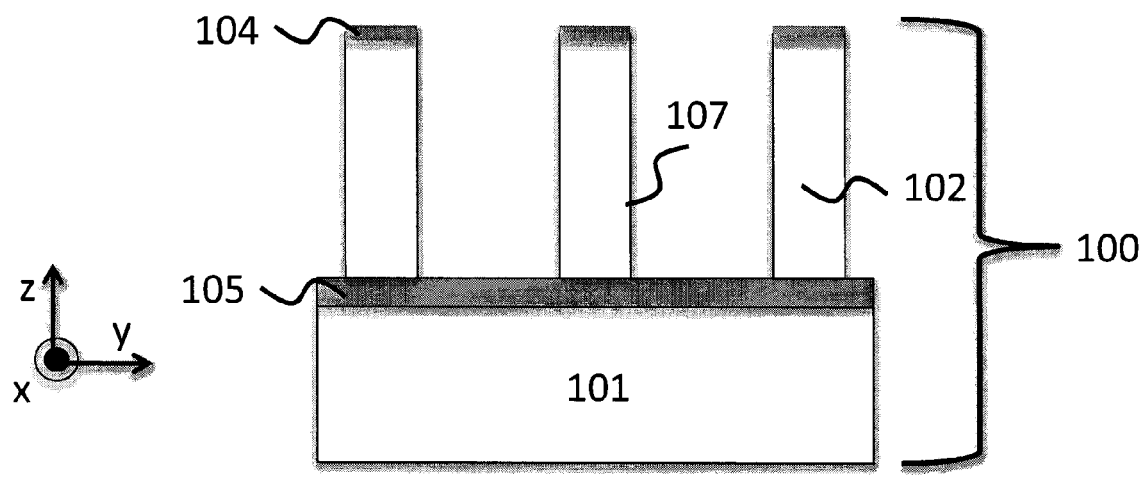
FIGS. 16A-16C illustrate a method of forming a plurality of single-crystalline Group III-Nitride films with a desired orientation on the elongated sidewalls of patterned features on a substrate.
Figure 16B:
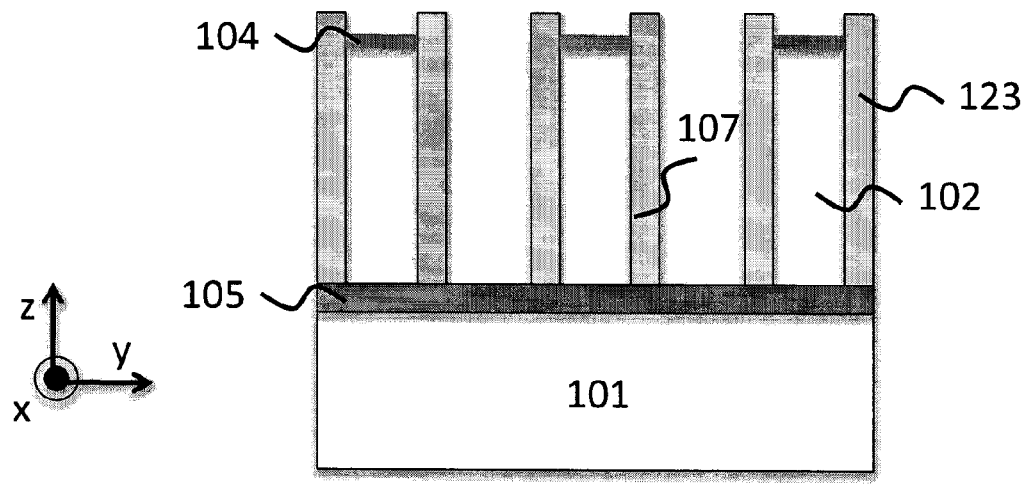
Figure 16C:
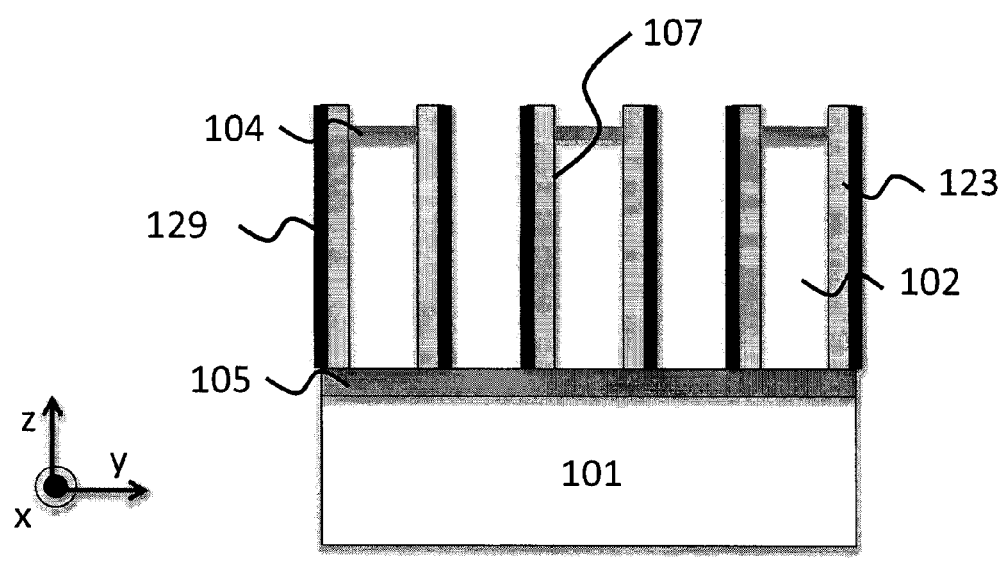

Another embodiment of the deposition process is shown in FIGS. 16A-16C, which illustrate the formation of a plurality of single crystal GaN films on each of the patterned feature sidewalls. In an embodiment, each sidewall is the basis of one or more semiconductor devices. Additional films form contacts and isolation layers in an embodiment of the invention.

In the embodiment illustrated in FIG. 16A, patterned substrate 100 is provided. Patterned substrate 100 may be formed by the process described above and shown in FIGS. 5A-5H. In another embodiment, a different process may be used to form patterned substrate 100. Patterned substrate 100 comprises substrate 101, first passivation layer 105 covering base substrate 101, patterned features 102 arranged on the top surface of first passivation layer 105, and top passivation layers 104, formed on the top of the patterned features 102 according to an embodiment of the invention.

In an embodiment of the invention, substrate 101 is (110) Si, and patterned features 102 are patterned along the <112-> direction to form elongated sidewalls 107 with a uniform (111) orientation. In another embodiment, substrate 101 is m-plane/(101-0) sapphire, and patterned features 102 are patterned along the <112-0> direction to form elongated sidewalls 107 with a uniform (0001)/c-plane orientation. In another embodiment, substrate 101 is a-plane/(112-0) sapphire, and patterned features 102 are patterned along the <101-0> to form elongated sidewalls 107 with a uniform (0001)/c-plane orientation. In an embodiment, an optional buffer layer (not shown) is formed on elongated sidewall 107, as described above in relation to FIG. 1B.

FIG. 16B illustrates the nucleation and growth of GaN on the elongated sidewalls 107 of patterned features 102 to form single crystal GaN films 103 in accordance with an embodiment of the invention. The GaN may be deposited by HVPE, MOCVD or MBE. In an embodiment, top passivation layers 104 prevent the formation of GaN on top of the patterned features 102, while first passivation layer 105 prevents deposition of GaN on the surface of substrate 101. GaN films 103 are grown to a thickness of 3-7 μm in the y-direction.

In an embodiment, c-plane GaN is nucleated on (111) Si elongated sidewalls 107 and grown laterally under deposition conditions favorable to c-plane growth. An illustration of how HVPE deposition conditions favor different growth planes is shown in FIG. 13. In another embodiment, c-plane GaN is nucleated on (0001)/c-plane sapphire elongated sidewalls 107 and grown laterally under deposition conditions favorable to c-plane growth.

FIG. 16C illustrates the formation of semiconductor devices through the formation of additional device layers 129 on top of GaN films 123, according to an embodiment of the present invention. In an embodiment of the invention, additional device layers 129 form an LED device, as illustrated in FIG. 3B. Each GaN film 123 is the basis of an individual LED device formed on each elongated sidewall 107 of patterned features 102. As such, the patterned features 102 are spaced farther apart, 50-100 μm, than the patterned features used to grow a single GaN film over the entire substrate, in order to allow room for the formation of additional device layers 129. Device layers 129 collectively may be 0.1-2 μm thick in the y-direction. Typically, device layers 129 are 0.8 μm thick in the y-direction. Patterned features 102 may also, in an embodiment, have a taller height dimension, ranging from 10-100 μm.

Wafer bowing occurs when a deposited film and the supporting substrate have a different coefficient of thermal expansion, so that the film exerts a compressive or tensile stress on the substrate, causing it to bow. Interfacial stresses can also lead to film delamination and device failure. In the embodiment depicted in FIGS. 16A-16C, bowing of substrate 101 is avoided by forming GaN layers 123 on elongated sidewalls 107 of patterned features 102, and not directly on substrate 101. In addition, the smaller area of GaN films 123 compared to those that would be formed on an entire substrate surface results in lower interfacial stresses in each film, thereby reducing the risk of delamination.

Figure 17:
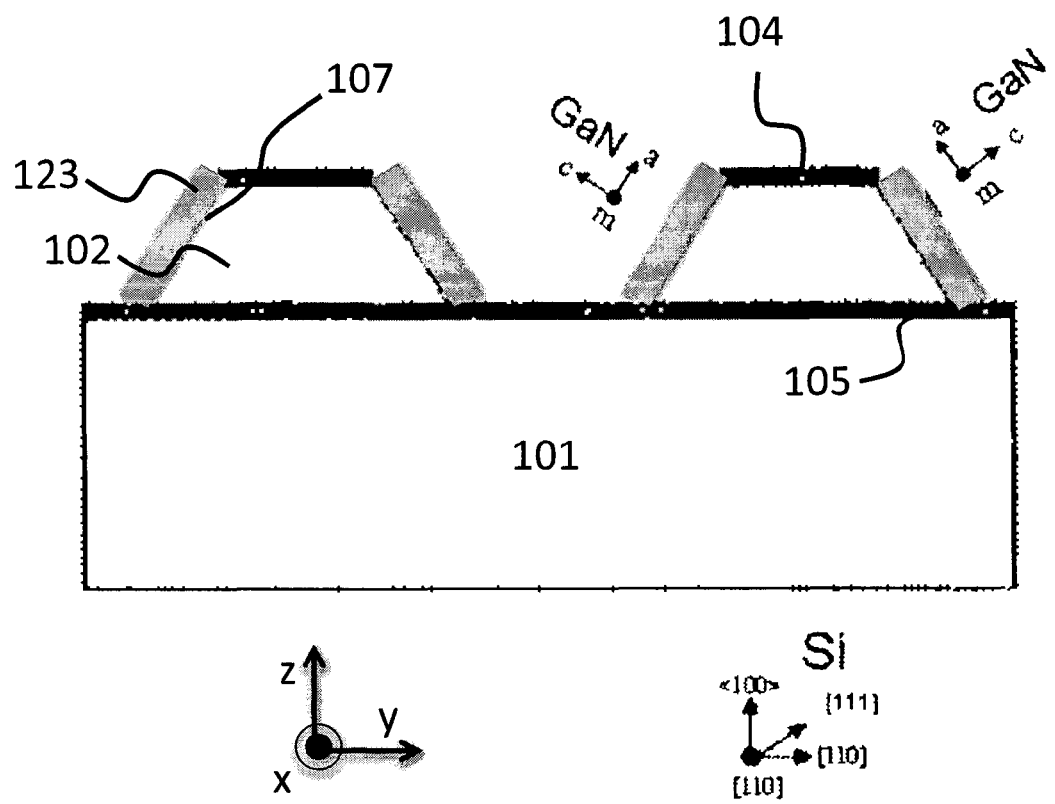
FIG. 17 is an illustration of the cross-section of an alternative embodiment of the method described in FIGS. 16A-16C.

FIG. 17 illustrates an embodiment of the invention where the patterned features 102 have tilted elongated sidewalls 107 on which GaN films 123 are formed. In an embodiment, patterned features 102 have a (100) Si orientation in the vertical/z-direction, and are patterned along the (110) direction to form tilted elongated sidewalls 107 with a (111) Si orientation. C-plane/(0001) GaN is nucleated on the (111) Si elongated sidewalls 107, and films 123 are grown in a substantially lateral direction out from the sidewall.

The vertical arrangement of patterned features 102 on substrate 101 affords the advantages of double-sided epitaxy without requiring significant modification to the reactor geometry and heating methods. In addition, the vertical arrangement enables a higher density of devices per unit area of the substrate as compared to conventional planar epitaxy. Further, throughput is increased.

Figure 18:
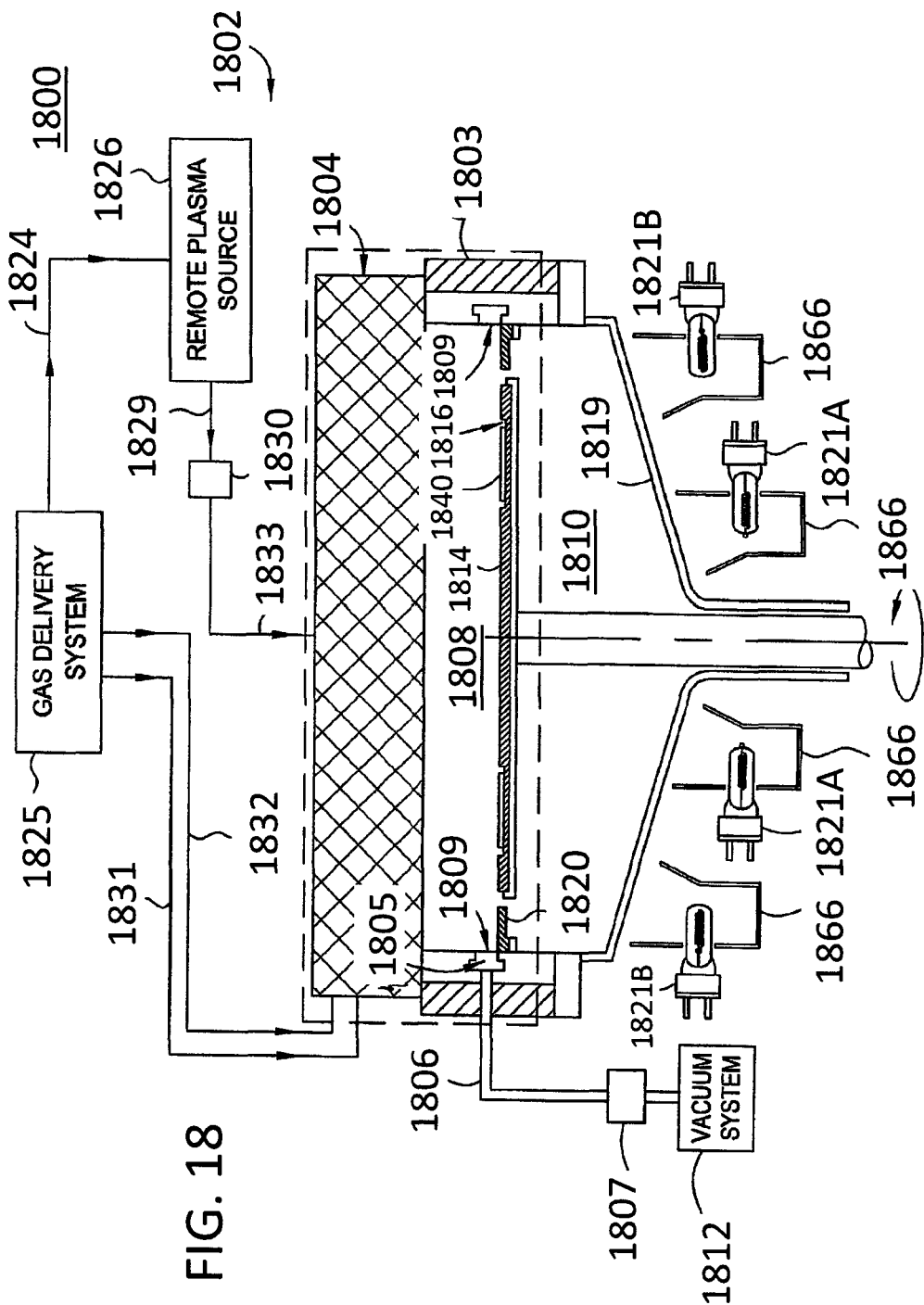
FIG. 18 is a schematic cross sectional view of an MOCVD chamber 1800\* according to one embodiment.

An example of an MOCVD deposition chamber that may be utilized for growth of Group III-Nitride films, in accordance with embodiments of the present invention, is illustrated and described with respect to FIG. 18.

FIG. 18 is a schematic cross-sectional view of an MOCVD chamber according to an embodiment of the invention. Exemplary systems and chambers that may be adapted to practice the present invention are described in U.S. patent application Ser. No. 11/404,516, filed on Apr. 14, 2006, and Ser. No. 11/429,022, filed on May 5, 2006, both of which are incorporated by reference in their entireties.

The apparatus 1800 shown in FIG. 18 comprises a chamber 1802, a gas delivery system 1825, a remote plasma source 1826, and a vacuum system 1812. The chamber 1802 includes a chamber body 1803 that encloses a processing volume 1808. A showerhead assembly 1804 is disposed at one end of the processing volume 1808, and a substrate carrier 1814 is disposed at the other end of the processing volume 1808. A lower dome 1819 is disposed at one end of a lower volume 1810, and the substrate carrier 1814 is disposed at the other end of the lower volume 1810. The substrate carrier 1814 is shown in process position, but may be moved to a lower position where, for example, the substrates 1840 may be loaded or unloaded. An exhaust ring 1820 may be disposed around the periphery of the substrate carrier 1814 to help prevent deposition from occurring in the lower volume 1810 and also help direct exhaust gases from the chamber 1802 to exhaust ports 1809. The lower dome 1819 may be made of transparent material, such as high-purity quartz, to allow light to pass through for radiant heating of the substrates 1840. The radiant heating may be provided by a plurality of inner lamps 1821A and outer lamps 1821B disposed below the lower dome 1819, and reflectors 1866 may be used to help control chamber 1802 exposure to the radiant energy provided by inner and outer lamps 1821A, 1821B. Additional rings of lamps may also be used for finer temperature control of the substrates 1840. The substrate carrier 1814 may include one or more recesses 1816 within which one or more substrates 1840 may be disposed during processing.

A gas delivery system 1825 may include multiple gas sources, or, depending on the process being run, some of the sources may be liquid sources rather than gases, in which case the gas delivery system may include a liquid injection system or other means (e.g., a bubbler) to vaporize the liquid. The vapor may then be mixed with a carrier gas prior to delivery to the chamber 1802. Different gases, such as precursor gases, carrier gases, purge gases, cleaning/etching gases or others may be supplied from the gas delivery system 1825 to separate supply lines 1831, 1832, and 1833 to the showerhead assembly 1804. The supply lines 1831, 1832, and 1833 may include shut-off valves and mass flow controllers or other types of controllers to monitor and regulate or shut off the flow of gas in each line.

A conduit 1829 may receive cleaning/etching gases from a remote plasma source 1826. The remote plasma source 1826 may receive gases from the gas delivery system 1825 via supply line 1824, and a valve 1830 may be disposed between the showerhead assembly 1804 and remote plasma source 1826.

A purge gas (e.g., nitrogen) may be delivered into the chamber 1802 from the showerhead assembly 1804 and/or from inlet ports or tubes (not shown) disposed below the substrate carrier 1814 and near the bottom of the chamber body 1803. The purge gas enters the lower volume 1810 of the chamber 1802 and flows upwards past the substrate carrier 1814 and exhaust ring 1820 and into multiple exhaust ports 1809 which are disposed around an annular exhaust channel 1805. An exhaust conduit 1806 connects the annular exhaust channel 1805 to a vacuum system 1812 that includes a vacuum pump (not shown). The chamber 1802 pressure may be controlled using a valve system 1807 which controls the rate at which the exhaust gases are drawn from the annular exhaust channel 1805.

Figure 19:
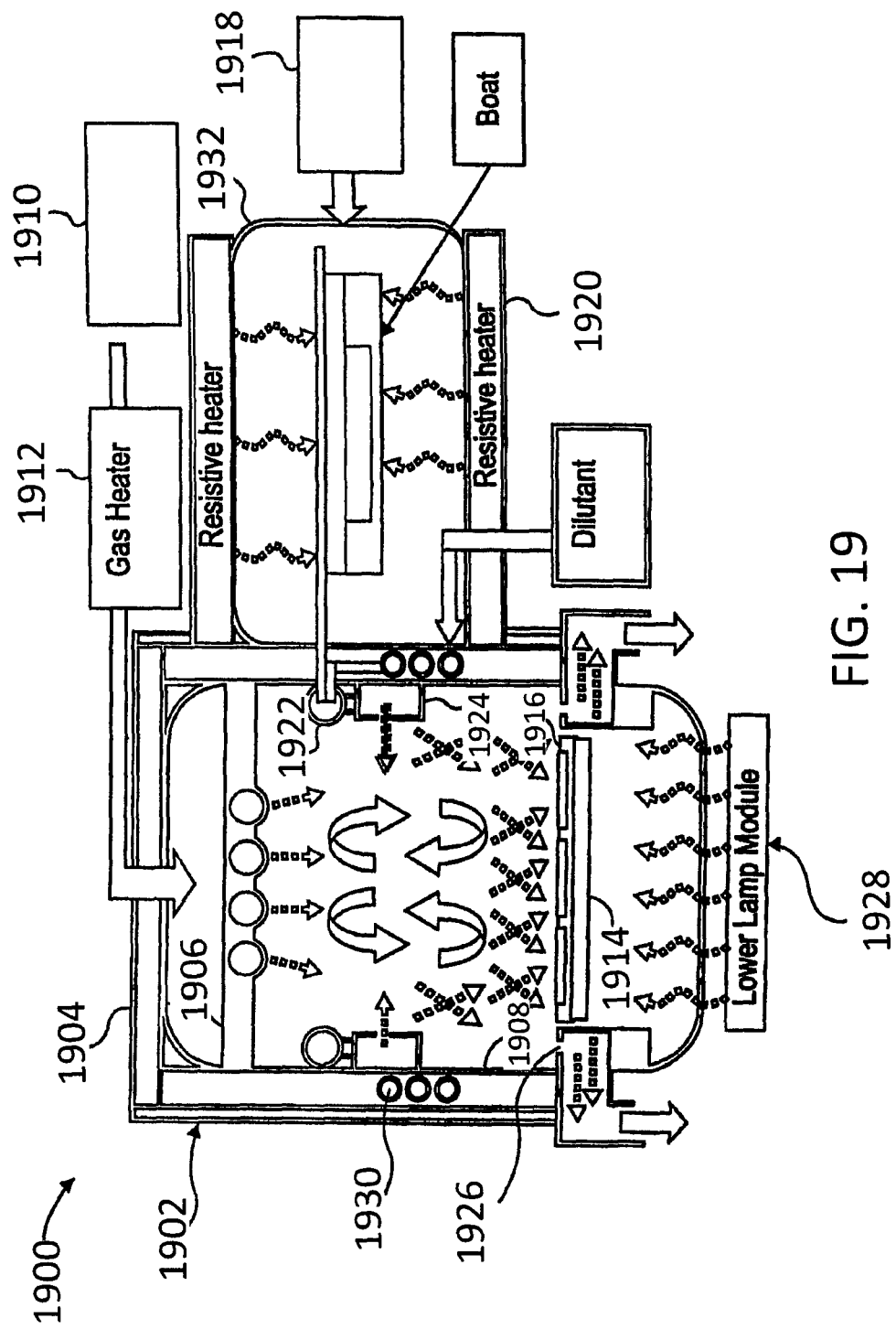
FIG. 19 is a schematic view of a HVPE apparatus 1900 according to one embodiment.

An example of a HVPE deposition chamber that may be utilized for dedicated growth of Group III-Nitride film, in accordance with embodiments of the present invention, is illustrated and described with respect to FIG. 19.

FIG. 19 is a schematic view of an HVPE apparatus 1900 according to one embodiment. The apparatus includes a chamber 1902 enclosed by a lid 1904. Processing gas from a first gas source 1910 is delivered to the chamber 1902 through a gas distribution showerhead 1906. In one embodiment, an inert gas such as helium or diatomic nitrogen may be introduced as well either through the gas distribution showerhead 1906 or through the walls 1908 of the chamber 1902. An energy source 1912 may be disposed between the gas source 1910 and the gas distribution showerhead 1906. In one embodiment, the energy source 1912 may comprise a heater. The energy source 1912 may break up the gas from the gas source 1910 to provide more reactive components of the gas. To react with the gas from the first source 1910, precursor material may be delivered from one or more second sources 1918. In order to increase the reactivity of the precursor, the precursor may be heated by a resistive heater 1920 within the second chamber 1932 in a boat.

A reaction product may then be delivered to the chamber 1902. The reaction product first enters a tube 1922 where it evenly distributes within the tube 1922. The tube 1922 is connected to another tube 1924. The reaction product enters the second tube 1924 after it has been evenly distributed within the first tube 1922. The reaction product then enters into the chamber 1902 where it mixes with a gas to form a material layer on the substrate 1916 that is disposed on a susceptor 1914. Other reaction products not contributing to deposition are exhausted through an exhaust 1926.

What is claimed is:

1. A method for forming a Group III-Nitride film, comprising:
providing a substrate having a monocrystalline layer with a first crystal orientation on a first passivation layer and a second passivation layer on the monocrystalline layer;
patterning the substrate to form patterned features with elongated sidewalls that have a second crystal orientation, wherein the first passivation layer is exposed in the spaces between the patterned features; growing a plurality of Group III-Nitride films from the exposed elongated sidewalls in the lateral direction, wherein Group III-Nitride is not grown from surfaces covered by the first passivation layer or the second passivation layer; and
alternating growth of the Group III-Nitride films in the lateral and vertical directions, causing them to coalesce over the top of the patterned features to form a single Group III-Nitride film with a third crystal orientation in the vertical direction.

2. The method of claim 1, wherein the monocrystalline layer is silicon.

3. The method of claim 2, wherein the first crystal orientation is (111), the second crystal orientation is selected from the group consisting of (110) and (112), and the third crystal orientation is (0001).

4. The method of claim 2, wherein the first crystal orientation is (110), the second crystal orientation is (111), and the third crystal orientation is (112-0).

5. The method of claim 2, wherein the first crystal orientation is (112-), the second crystal orientation is (111), and the third crystal orientation is (101-0).

6. The method of claim 2, wherein the silicon monocrystalline layer is offcut, the second crystal orientation is selected from the group consisting of (111) and (110), and the third crystal orientation is a semi-polar orientation of Group III-Nitride.

7. The method of claim 1, wherein the monocrystalline layer is sapphire.

8. The method of claim 1, wherein the first crystal orientation is offcut.

9. The method of claim 1, wherein the second crystal orientation is offcut.

10. The method of claim 1, wherein the Group III-Nitride is GaN.

11. The method of claim 1, further comprising forming additional device layers on the Group III-Nitride film to form a semiconductor device.

12. The method of claim 11, wherein the Group III-Nitride film comprises n-type dopants, and wherein the additional device layers comprise an active region, an electron blocking layer, and a p-type contact layer.

13. A method for forming a plurality of Group III-Nitride films, comprising:
providing a substrate having a monocrystalline layer with a first crystal orientation on a first passivation layer and a second passivation layer on the monocrystalline layer;
patterning the substrate to form patterned features with elongated sidewalls that have a second crystal orientation, wherein the first passivation layer is exposed in the spaces between the patterned features; and
growing a plurality of Group III-Nitride films from the exposed elongated sidewalls in the lateral direction, wherein Group III-Nitride film is not grown from surfaces covered by the first passivation layer or the second passivation layer.

14. The method of claim 13, wherein the monocrystalline layer is silicon.

15. The method of claim 14, wherein the first crystal orientation is (110), the second crystal orientation is (111), and wherein the plurality of Group III-Nitride films have a third crystal orientation in the vertical direction wherein the third crystal orientation is (0001).

16. The method of claim 13, wherein the monocrystalline layer is sapphire.

17. The method of claim 16, wherein the first crystal orientation is selected from the group consisting of (101-0) and (112-0), the second crystal orientation is (0001), and wherein the plurality of Group III-Nitride films have a third crystal orientation in the vertical direction wherein the third crystal orientation is (0001).

18. The method of claim 13, wherein the first crystal orientation is off cut.

19. The method of claim 13, wherein the second crystal orientation is off cut.

20. The method of claim 13, wherein the height of each feature is 25-75μm.

21. The method of claim 13, further comprising forming additional device layers over each of the Group III-Nitride films to form a plurality of semiconductor devices.

22. The method of claim 21, wherein the Group III-Nitride film comprises n-type dopants, and wherein the additional device layers comprise an n-type contact layer, an active region, an electron blocking layer, and a p-type contact layer.

* * * * *

UNITED STATES PATENT AND TRADEMARK OFFICE
CERTIFICATE OF CORRECTION

PATENT NO. : 8,709,921 B2  
APPLICATION NO. : 13/286097  
DATED : April 29, 2014  
INVENTOR(S) : Su Page 1 of 1

It is certified that error appears in the above-identified patent and that said Letters Patent is hereby corrected as shown below:

In the Specification

Column 2, line 53, replace "on a patterned features" with "on patterned features"

Column 2, line 65, replace "Cl-$_2$" with "Cl$_2$"

Column 9, line 2, replace "1-4 82 m," with "1-4 μm"

Column 9, line 66, replace "In FIG. 51" with "In FIG. 5I"

Column 11, line 66, replace "offcut angle a" with "offcut angle α"

Column 12, line 3, replace "offcut angle a" with "offcut angle α"

Column 12, line 5, replace "offcut angle a" with "offcut angle α"

Column 12, line 19, replace "35.3 degree" with "35.3 degrees"

Column 12, line 23, replace "offcut angle a" with "offcut angle α"

Column 14, lines 8-9, replace "form light emitting" with "form a light emitting"

Signed and Sealed this  
Twenty-third Day of September, 2014

Michelle K. Lee  
*Deputy Director of the United States Patent and Trademark Office*